US008307538B2

(12) United States Patent
Hata

(10) Patent No.: US 8,307,538 B2
(45) Date of Patent: Nov. 13, 2012

(54) METHOD FOR MANUFACTURING HEAD GIMBAL ASSEMBLY, AND METHOD FOR MANUFACTURING HARD DISK DRIVE

(75) Inventor: Kenjiro Hata, Tokyo (JP)

(73) Assignees: TDK Corporation, Tokyo (JP); SAE Magnetics (H.K.) Ltd., Hong Kong (CN)

( * ) Notice: Subject to any disclaimer, the term of this patent is extended or adjusted under 35 U.S.C. 154(b) by 227 days.

(21) Appl. No.: 12/715,005

(22) Filed: Mar. 1, 2010

(65) Prior Publication Data
US 2010/0232069 A1 Sep. 16, 2010

(30) Foreign Application Priority Data

Mar. 16, 2009 (JP) ................. 2009-062783

(51) Int. Cl.
*G11B 5/127* (2006.01)
*H04R 31/00* (2006.01)

(52) U.S. Cl. ............ 29/603.04; 29/25.35; 29/603.03; 29/603.06; 29/603.07; 360/234.5; 360/245.8; 360/245.9; 360/264.2; 360/294.4

(58) Field of Classification Search ............... 29/25.35, 29/603.04, 603.06, 603.07, 603.12, 729, 29/737; 360/234.5, 245.8, 245.9, 264.2, 360/294.4, 294.6
See application file for complete search history.

(56) References Cited

U.S. PATENT DOCUMENTS

| 3,072,805 | A | * | 1/1963 | Rich .............................. 310/314 |
| 4,237,399 | A | * | 12/1980 | Sakamoto ..................... 310/317 |
| 6,344,954 | B1 | * | 2/2002 | Redon et al. ................ 360/324.2 |
| 7,072,150 | B2 | * | 7/2006 | Kuwajima et al. ......... 360/294.4 |
| 7,141,911 | B2 | | 11/2006 | Kita et al. |
| 2002/0097529 | A1 | * | 7/2002 | Sato et al. .................. 360/294.4 |

FOREIGN PATENT DOCUMENTS

| JP | A-2002-117637 | 4/2002 |
| JP | A-2004-180496 | 6/2004 |
| JP | A-2004-281651 | 10/2004 |

OTHER PUBLICATIONS

Office Action issued in Japanese Patent Application No. 2009-062783 dated Mar. 29, 2011.

* cited by examiner

*Primary Examiner* — Paul D Kim
(74) *Attorney, Agent, or Firm* — Oliff & Berridge, PLC

(57) ABSTRACT

A method for manufacturing an head gimbal assembly (HGA) according to the present invention is comprised of: a step for preparing a thin film piezoelectric actuator including a first piezoelectric laminate having a first piezoelectric layer, and a second piezoelectric laminate having a second piezoelectric layer; a step for preparing a suspension; a fixing step for fixing the thin film piezoelectric actuator to the suspension; a first repolarization treatment step for performing repolarization treatment to the first piezoelectric layer after the fixing step; and a second repolarization treatment step for performing repolarization treatment to the second piezoelectric layer after the fixing step.

6 Claims, 17 Drawing Sheets

METHOD FOR MANUFACTURING HEAD GIMBAL ASSEMBLY, AND METHOD FOR MANUFACTURING HARD DISK DRIVE

BACKGROUND OF THE INVENTION

1. Field of the Invention

The present invention relates to a method for manufacturing a head gimbal assembly, a method for manufacturing a hard disk drive, a head gimbal assembly, and a hard disk drive.

2. Related Background Art

In order to increase the density and the capacity of a hard disk drive, the need for thin film piezoelectric actuators for use in high precision positioning mechanisms for tracking is becoming increasingly high in recent years. By arranging a thin film piezoelectric actuator in a head gimbal assembly comprised of a head slider and a suspension to which the head slider is mounted, the head slider can be minutely displaced using a thin film piezoelectric actuator. Thus, it is possible to obtain a head gimbal assembly capable of controlling the position of a head slider with high precision. Japanese Patent Application Laid-Open No. 2004-281651 describes an example of such a thin film piezoelectric actuator.

The thin film piezoelectric actuator described in Japanese Patent Application Laid-Open No. 2004-281651 includes a pair of piezoelectric device units 1, 2 arranged on the surface of a substrate in mirror symmetrical form. The piezoelectric device unit 1 includes two laminated thin film piezoelectric devices 4, 5, that is, two piezoelectric layers. The piezoelectric device unit 2 also has the same configuration. By arranging a thin film piezoelectric actuator having one pair of such piezoelectric device units (piezoelectric laminates) in a head gimbal assembly, it is possible to displace the head slider greatly by, for example, expanding and contracting a pair of piezoelectric device units, each of which are in opposite phase with each other.

SUMMARY OF THE INVENTION

Each of the pair of piezoelectric device units (piezoelectric laminates) of the thin film piezoelectric actuator described in Japanese Patent Application Laid-Open No. 2004-281651 has two layers of piezoelectric layers as described above. Therefore, they have problems in that the structure is complicated, mass production cannot be easily done, and the manufacturing cost is high. In contrast, if a thin film piezoelectric actuator includes a pair of piezoelectric laminates, each having a monolayer piezoelectric layer, such problems improve.

However, in a thin film piezoelectric actuator which includes a pair of piezoelectric laminates, each having a monolayer piezoelectric layer (hereafter may be referred to as a "monolayer type thin film piezoelectric actuator"), if it is subjected to stress, for example, upon fixing it to a suspension, an electric field is generated in the piezoelectric layer by a positive piezoelectric effect, which produces polarization in the piezoelectric body. There are cases when an electric field (polarization) generated by such a mechanical stress—causes the direction of the spontaneous polarization of a piezoelectric layer to fluctuate or reverse, to thereby cause a reduction in the characteristic of the thin film piezoelectric actuator.

In cases where the thin film piezoelectric actuator (two-layer type thin film piezoelectric actuator) including a pair of piezoelectric laminates having two layers of piezoelectric layers is used, the problem such as when the direction of the piezoelectric polarization is fluctuated or is reversed as described above may not pose much trouble. This is because, as to the two-layer type thin film piezoelectric actuator, it is structurally more rigid than a monolayer type thin film piezoelectric actuator. Therefore, the polarization due to the positive piezoelectric effect tends not to be produced in the piezoelectric layer, and moreover, even if an electric charge is generated in each of the upper and lower piezoelectric layers which were laminated due to ionic displacement caused by a positive piezoelectric effect, it is possible to connect the upper and lower piezoelectric layers with wires such that these electric charges offset each other. In contrast, in monolayer type thin film piezoelectric actuators, the reduction in the characteristic of the thin film actuator resulting from problems such as the direction of the piezoelectric polarization fluctuating or reversing, as described above, poses a big problem.

The present invention was achieved in view of the above-described problems, and the objective of the present invention is to provide a method for manufacturing a head gimbal assembly comprised of a monolayer type thin film piezoelectric actuator capable of suppressing the characteristic reduction resulting from directions of piezoelectric polarization fluctuating or reversing, a method for manufacturing a hard disk drive comprising such a head gimbal assembly, and a head gimbal assembly comprising a monolayer type thin film piezoelectric actuator capable of suppressing the characteristic reduction resulting from directions of piezoelectric polarization fluctuating or reversing, and a hard disk drive comprising such a head gimbal assembly.

In order to solve the above-described problems, in a method for manufacturing a head gimbal assembly in accordance with an aspect of the invention, the head gimbal assembly is comprised of: a head slider having a thin film magnetic head for performing at least one of recording to and reproduction from a magnetic recording medium; a suspension to which the head slider is mounted; and a thin film piezoelectric actuator for displacing the head slider relatively to the suspension; and the method is comprised of: a step for preparing the thin film piezoelectric actuator, the thin film piezoelectric actuator including a first piezoelectric laminate including a first electrode layer, a second electrode layer, and a first piezoelectric layer provided between the first electrode layer and the second electrode layer, and a second piezoelectric laminate including a third electrode layer, a fourth electrode layer, and a second piezoelectric layer provided between the third electrode layer and the fourth electrode layer, and wherein the first piezoelectric layer has a first polarization vector that has a component of a direction that orients from the first electrode layer to the second electrode layer, the first piezoelectric laminate does not include a piezoelectric layer other than the first piezoelectric layer, the second piezoelectric layer has a second polarization vector that has a component of a direction that orients from the third electrode layer to the fourth electrode layer, the second piezoelectric laminate does not include a piezoelectric layer other than the second piezoelectric layer, the first piezoelectric laminate and the second piezoelectric laminate are not formed integrally so as to laminate in thickness directions of the first piezoelectric laminate and the second piezoelectric laminate, and the first electrode layer, the second electrode layer, the third electrode layer, and the fourth electrode layer are not electrically-conductive with each other; a suspension preparation step for preparing the suspension, the suspension including a first electrode, a second electrode, a third electrode, and a fourth electrode for electrically-connecting to the first electrode layer, the second electrode layer, the third electrode layer, and the fourth electrode layer, respectively, and a thin film piezoelectric actuator mounting area comprising a first area in which the first piezoelectric laminate is mounted, and a second area in which the second piezoelectric laminate is mounted; a fixing step for fixing the thin film piezoelectric actuator to the thin film piezoelectric actuator mounting area of the suspension; an electrical connecting step for electrically-connecting the first electrode layer, the second electrode layer, the third electrode layer, and the fourth electrode layer to the first electrode, the second electrode, the third electrode, and the fourth electrode, respectively; a first repolarization treatment step for performing repolarization treatment to the first piezoelectric layer by applying voltage between the first electrode layer and the second electrode layer such that, after the fixing step, an electric field having a direction that orients from the first electrode layer to the second electrode layer is generated in the first piezoelectric layer, and an electric field having a direction opposite to a direction that orients from the third electrode layer to the fourth electrode layer is not generated in the second piezoelectric layer; a second repolarization treatment step for performing repolarization treatment to the second piezoelectric layer by applying voltage between the third electrode layer and the fourth electrode layer such that, after the fixing step, an electric field having a direction that orients from the third electrode layer to the fourth electrode layer is generated in the second piezoelectric layer, and an electric field having a direction opposite to a direction that orients from the first electrode layer to the second electrode layer is not generated in the first piezoelectric layer; and a step for fixing the head slider to the suspension.

In accordance with the method for manufacturing the head gimbal assembly according to the aspect of the invention, it is possible to obtain a head gimbal assembly comprised of a thin film piezoelectric actuator including a pair of piezoelectric laminates, each having a monolayer piezoelectric layer, that is, a monolayer type thin film piezoelectric actuator. Furthermore, in accordance with the method for manufacturing a head gimbal assembly according to the aspect of the invention, after fixing a thin film piezoelectric actuator to a suspension, each of the first piezoelectric layer and the second piezoelectric layer is subjected to repolarization treatment. Therefore, upon fixing the thin film piezoelectric actuator to a suspension, even if the thin film piezoelectric actuator is subjected to stress, and an electric field is generated in the first piezoelectric layer and the second piezoelectric layer by a positive piezoelectric effect, and the direction of the piezoelectric polarization of the first piezoelectric layer and the second piezoelectric layer is fluctuated or is reversed by this electric field, it is possible to restore the directions of the piezoelectric polarization of the first piezoelectric layer and the second piezoelectric layer to the original state, or to make them approach to the original state. As a result, it is possible to suppress the characteristic reduction of the thin film piezoelectric actuator resulting from the direction of piezoelectric polarization fluctuating or being reversed.

Furthermore, in the method for manufacturing the head gimbal assembly according to an aspect of the invention, it is preferable if the first electrode, the second electrode, the third electrode, and the fourth electrode of the suspension prepared in the suspension preparation step are not electrically-conductive with each other, and the method further is comprised of an inter-electrode connecting step for electrically-connecting the first electrode to either one of the third electrode and the fourth electrode, and electrically-connecting the second electrode to another one of the third electrode and the fourth electrode.

Thereby, when operating the thin film piezoelectric actuator, by only applying voltage to two locations, it is possible to apply voltage to all of the first electrode, the second electrode, the third electrode, and the fourth electrode. As a result, upon using the thin film piezoelectric actuator in a hard disk drive, it is possible to obtain a head gimbal assembly that can simplify the circuitry.

Furthermore, in the method for manufacturing a head gimbal assembly according to an aspect of the invention, it is preferable if the inter-electrode connecting step is performed after the first repolarization treatment step and the second repolarization treatment step, and in the inter-electrode connecting step, the first electrode and the fourth electrode are electrically-connected, and the second electrode and the third electrode are electrically-connected.

Thereby, it is possible to operate the thin film piezoelectric actuator such that the first piezoelectric layer and the second piezoelectric layer expand and contract in opposite phase with each other, and more specifically, upon the first piezoelectric layer expanding in the thickness direction (that is, upon the first piezoelectric layer contracting in the in-plane direction), the second piezoelectric layer contracts in the thickness direction (that is, the second piezoelectric layer expands in the in-plane direction). Therefore, it is possible to enlarge the displacement range of the head slider.

Furthermore, in the method for manufacturing the head gimbal assembly according to an aspect of the invention, it is preferable if the suspension prepared in the suspension preparation step further including: a first electrically-conductive member which adjoins with both the first electrode and the fourth electrode and is not electrically-conductive with both the first electrode and the fourth electrode; and a second electrically-conductive member which adjoins with both the second electrode and the third electrode and is not electrically-conductive with both the second electrode and the third electrode; and wherein the electrical connecting step is performed after the first repolarization treatment step and the second repolarization treatment step, the electrical connection of the first electrode and the fourth electrode and the electrical connection of the second electrode and the third electrode in the inter-electrode connecting step is achieved by electrically-connecting further the first electrode and the fourth electrode to the first electrically-conductive member, and electrically-connecting the second electrode and the third electrode to the second electrically-conductive member, in the electrical connecting step.

Thereby, it is possible to perform the inter-electrode connecting step also in the electrical connecting step, and therefore, it is possible to simplify the manufacturing process.

A method for manufacturing a hard disk drive in accordance with an aspect of the invention is comprised of: a step for manufacturing a head gimbal assembly using any of the above methods for manufacturing a head gimbal assembly; and a power source connecting step for electrically-connecting each of the first electrode, the second electrode, the third electrode, and the fourth electrode, to the power source.

In accordance with the method for manufacturing a hard disk drive according to the aspect of the invention, it is possible to suppress the characteristic reduction of the thin film piezoelectric actuator resulting from the direction of the piezoelectric polarization of the first piezoelectric layer and the second piezoelectric layer fluctuating or being reversed upon fixing the thin film piezoelectric actuator to the suspension.

Furthermore, according to the method for manufacturing a hard disk drive in accordance with an aspect of the invention, in the power source connecting step, each of the first electrode, the second electrode, the third electrode, and the fourth electrode are electrically-connected to the power source such that the first piezoelectric layer and the second piezoelectric layer are capable to expand and contract in opposite phase with each other.

Thereby, it is possible to operate the thin film piezoelectric actuator such that the first piezoelectric layer and the second piezoelectric layer expand and contract in opposite phase with each other. As a result, it is possible to enlarge the range of displacement of the head slider performed by the thin film piezoelectric actuator.

According to the head gimbal assembly in accordance with an aspect of the invention, the head gimbal assembly is comprised of: a head slider which has a thin film magnetic head for performing at least one of recording to and reproduction from a magnetic recording medium; a suspension to which the head slider is mounted; and a thin film piezoelectric actuator for displacing the head slider relatively to the suspension; and wherein the thin film piezoelectric actuator includes: a first piezoelectric laminate including a first electrode layer, a second electrode layer, and a first piezoelectric layer provided between the first electrode layer and the second electrode layer; and a second piezoelectric laminate including a third electrode layer, a fourth electrode layer, and a second piezoelectric layer provided between the third electrode layer and the fourth electrode layer; and wherein the first piezoelectric layer has a first polarization vector that has a component of a direction that orients from the first electrode layer to the second electrode layer, the first piezoelectric laminate does not include a piezoelectric layer other than the first piezoelectric layer, the second piezoelectric layer has a second polarization vector that has a component of a direction that orients from the third electrode layer to the fourth electrode layer, the second piezoelectric laminate does not include a piezoelectric layer other than the second piezoelectric layer, the first piezoelectric laminate and the second piezoelectric laminate are not formed integrally so as to laminate in thickness directions of the first piezoelectric laminate and the second piezoelectric laminate, the first electrode layer, the second electrode layer, the third electrode layer, and the fourth electrode layer are not electrically-conductive with each other, the suspension includes: a first electrode, a second electrode, a third electrode, and a fourth electrode electrically-connected to the first electrode layer, the second electrode layer, the third electrode layer, and the fourth electrode layer, respectively; a thin film piezoelectric actuator mounting area including a first area in which the first piezoelectric laminate is mounted, and a second area in which the second piezoelectric laminate is mounted; and wherein the first electrode, the second electrode, the third electrode, and the fourth electrode are not electrically-conductive with each other, and the thin film actuator is fixed to the thin film piezoelectric actuator mounting area of the suspension.

The head gimbal assembly according to the aspect of the invention is a head gimbal assembly comprising a thin film piezoelectric actuator including a pair of piezoelectric laminates each having a monolayer piezoelectric layer, that is, a monolayer type thin film piezoelectric actuator. Furthermore, in the head gimbal assembly according to the aspect of the invention, the first electrode layer, the second electrode layer, the third electrode layer, and the fourth electrode layer are not electrically-conductive with each other, and the first electrode, the second electrode, the third electrode, and the fourth electrode are also not electrically-conductive with each other as well. Therefore, in accordance with the head gimbal assembly according to the aspect of the invention, even if the thin film piezoelectric actuator is subjected to stress upon, for example, fixing the thin film piezoelectric actuator to the suspension, an electric field is generated in the first piezoelectric layer and the second piezoelectric layer by a positive piezoelectric effect, and the direction of the piezoelectric polarization of the first piezoelectric layer and the second piezoelectric layer is fluctuated or is reversed by the electric field, it is possible to restore the direction of the piezoelectric polarization of the first piezoelectric layer to the original state or to make it approach to the original state by applying voltage between the first electrode layer and the second electrode layer such that an electric field having a direction that orients from the first electrode layer to the second electrode layer is generated in the first piezoelectric layer, and by means of applying voltage between the third electrode layer and the fourth electrode layer such that an electric field having a direction that orients from the third electrode layer to the fourth electrode layer is generated in the second piezoelectric layer, it is possible to restore the direction of the piezoelectric polarization of the second piezoelectric layer to the original state or to make it approach to the original state. As a result, it is possible to suppress the characteristic reduction of the thin film piezoelectric actuator resulting from the direction of piezoelectric polarization fluctuating or being reversed.

A hard disk drive according to an aspect of the invention is comprised of: the above head gimbal assembly; and a thin film piezoelectric actuator driving power source electrically-connected to each of the first electrode, the second electrode, the third electrode, and the fourth electrode.

In accordance with the hard disk drive according to the aspect of the invention, it is possible to suppress the characteristic reduction of the thin film piezoelectric actuator resulting from the direction of piezoelectric polarization fluctuating or being reversed as described above.

In accordance with a hard disk drive according to an aspect of the invention, it is preferable if the thin film piezoelectric actuator driving power source is electrically-connected to each of the first electrode, the second electrode, the third electrode, and the fourth electrode such that the first piezoelectric layer and the second piezoelectric layer are capable to expand and contract in opposite phase with each other.

Thereby, it is possible to operate the thin film piezoelectric actuator such that the first piezoelectric layer and the second piezoelectric layer expand and contract in opposite phase with each other. As a result, it is possible to enlarge the displacement range of the head slider.

In the hard disk drive according to an aspect of the invention, it is preferable if the hard disk drive is further comprised of: a repolarization treatment power source for performing repolarization treatment to the first piezoelectric layer and the second piezoelectric layer; and a switch for switching reversibly from a first state where each of the first electrode, the second electrode, the third electrode, and the fourth electrode are electrically-connected to the thin film piezoelectric actuator driving power source, to a second state where each of the first electrode, the second electrode, the third electrode, and the fourth electrode are electrically-connected to the repolarization treatment power source.

Therefore, even if the direction of the polarization of the first piezoelectric layer or the second piezoelectric layer is fluctuated or is reversed due to, for example, polarization fatigue of the hard disk drive in use, it is possible to perform repolarization of the first piezoelectric layer or the second piezoelectric layer using the repolarization treatment power source, and to restore the direction of the polarization of the piezoelectric layers to the original state or to make it approach to the original state. As a result, even if the characteristic of the thin film piezoelectric actuator is reduced due to, for example, the polarization fatigue of the hard disk drive in use, it is possible to recover the characteristic easily.

In accordance with the present invention, there is provided a method for manufacturing a head gimbal assembly comprising a monolayer type thin film piezoelectric actuator, and a method for manufacturing a hard disk drive comprising such a head gimbal assembly, capable of suppressing the characteristic reduction resulting from the direction of piezoelectric polarization fluctuating or being reversed, and a head gimbal assembly comprising a monolayer type thin film piezoelectric actuator and a hard disk drive comprising such a head gimbal assembly, capable of suppressing the characteristic reduction resulting from the direction of piezoelectric polarization fluctuating or being reversed.

DESCRIPTION OF THE PREFERRED EMBODIMENTS

Figure 1:
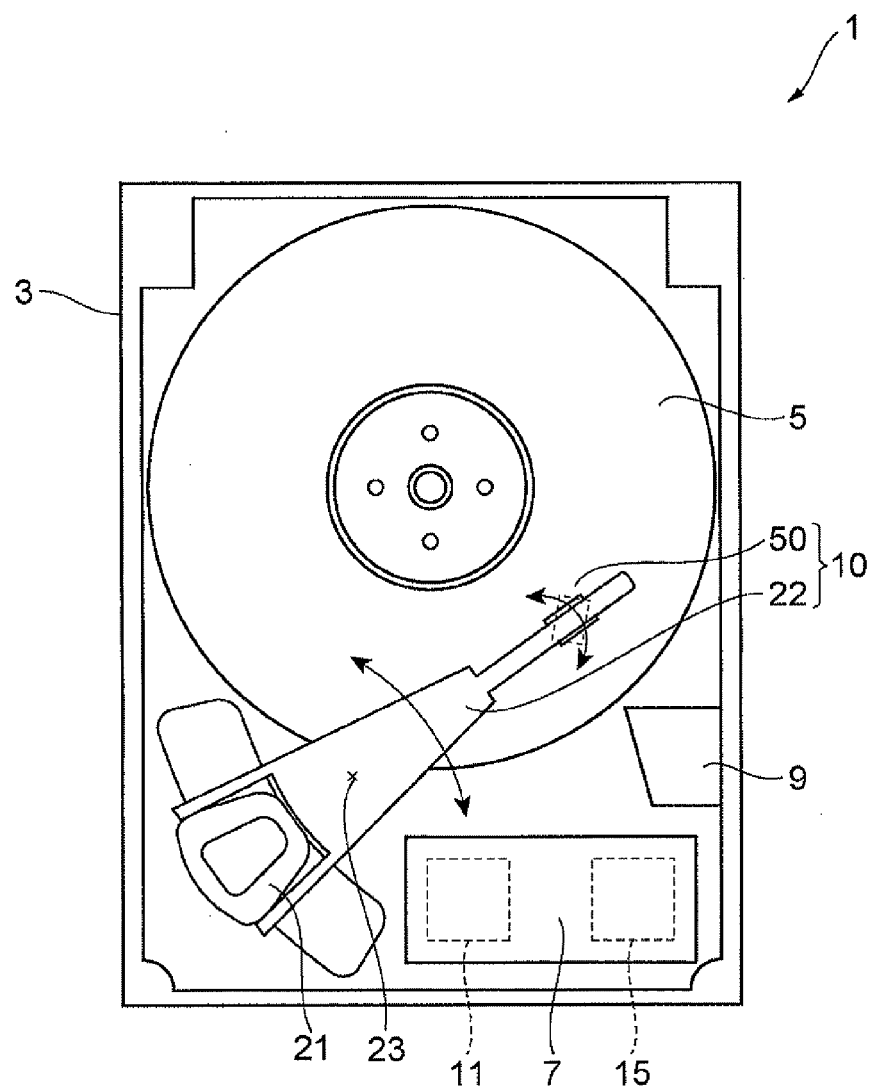
FIG. 1 is a schematic view illustrating a hard disk drive comprising an HGA in accordance with the first embodiment.

In the following, head gimbal assemblies (HGA), hard disk drives, and methods for manufacturing the HGAs and the hard disk drives in accordance with the embodiments of the invention will be described in detail with reference to accompanying drawings. In the drawings, wherever possible, the same reference symbols are used for the same elements. The dimensional ratios inside the elements in the drawings and between the elements in the drawings are arbitrary for the convenience of viewing.

First Embodiment

In the following, an HGA and a hard disk drive in accordance with the first embodiment will be described. FIG. 1 is a schematic view illustrating a hard disk drive comprising an HGA in accordance with the present embodiment. The hard disk unit 1 operates an HGA 10, and records and reproduces magnetic information onto and from a recording surface of a hard disk 5 which functions as a magnetic recording medium that rotates at high speed using thin film magnetic heads of ahead slider 50.

The hard disk unit 1 includes in its housing 3, the hard disk 5, the HGA 10 to which and from which magnetic information is recorded and reproduced, a control unit 7 which, for example, performs control of recording and reproduction of magnetic information onto and from the hard disk 5 by the HGA 10, and a ramp mechanism 9 for evacuating the thin film magnetic head from the hard disk 5.

The hard disk 5 is rotated by a motor. The HGA 10 is capable of rotating around a pivot 23 by means of a voice coil motor (VCM) 21. The HGA 10 has a head slider 50 attached thereon such that the head slider 50 corresponds to the arrangement of the hard disk 5.

The control unit 7 has a power source 11 for driving a thin film piezoelectric actuator, which will be described later, and a switch 15 for changing the electrical connection relationship between the thin film piezoelectric actuator and the power source 11.

Figure 2:
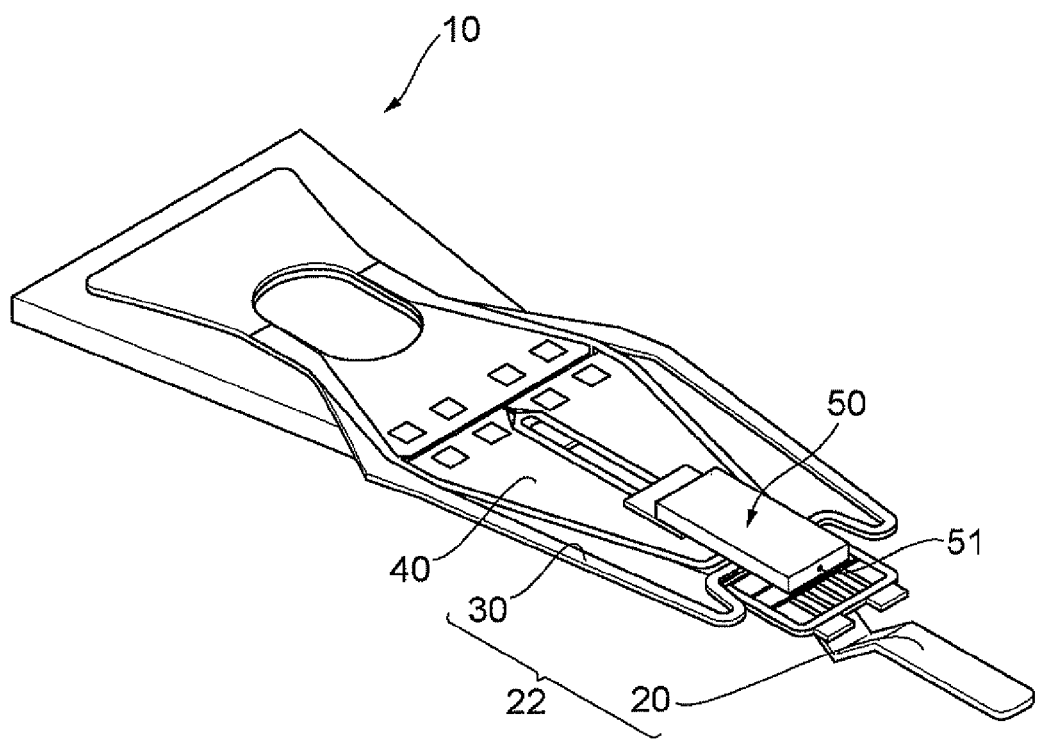
FIG. 2 is an expanded perspective view of the HGA in FIG. 1.
Figure 3:
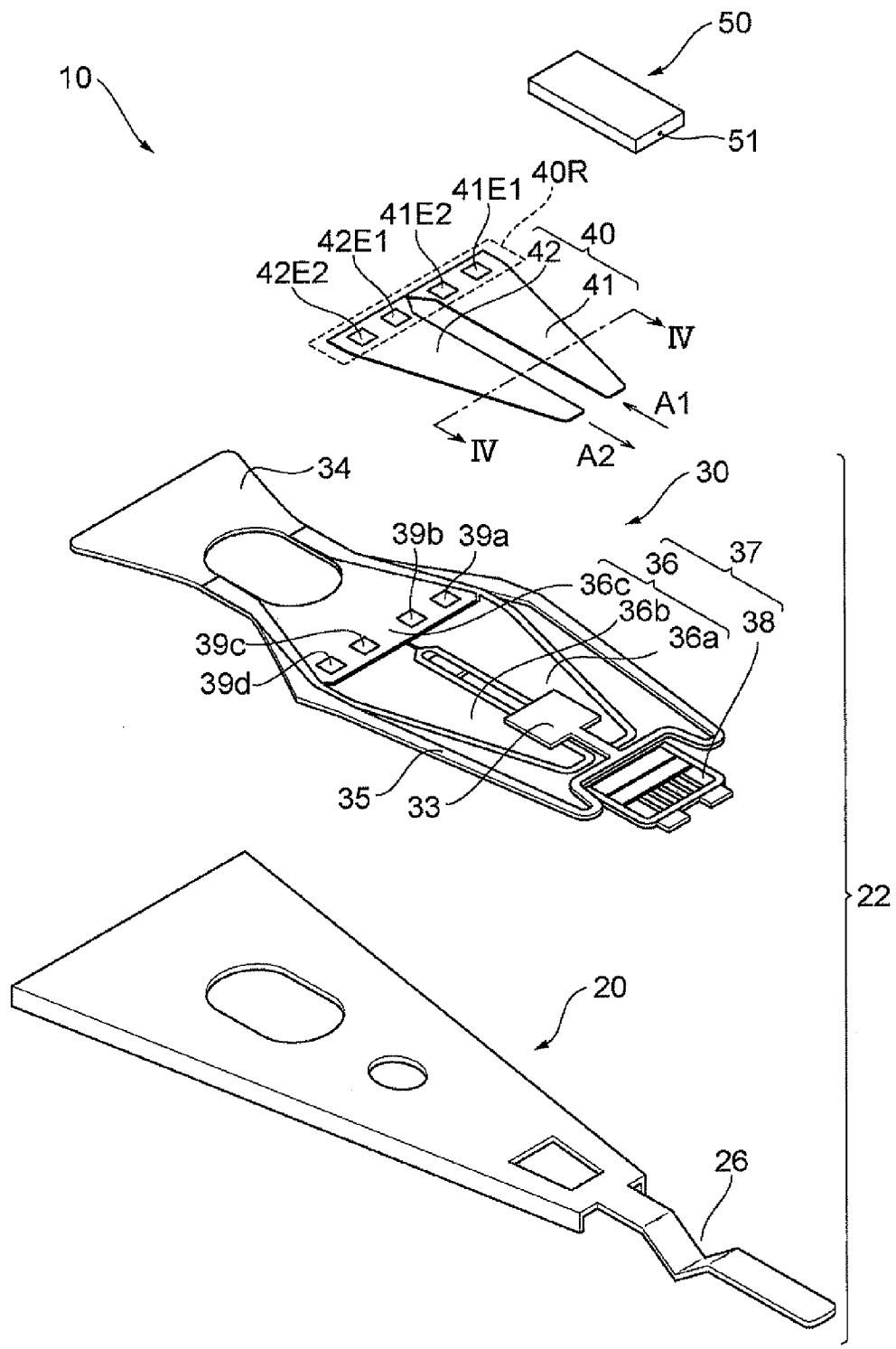
FIG. 3 is an exploded perspective view of the HGA in FIG. 2.

In the following, an arrangement of the HGA 10 will be described in detail. FIG. 2 is an expanded perspective view of the HGA in FIG. 1, and FIG. 3 is an exploded perspective view of the HGA in FIG. 2. As shown in FIG. 2 and FIG. 3, the HGA 10 has a suspension 22 comprised of a suspension arm 20 and a flexure 30, a thin film piezoelectric actuator 40 provided on the flexure 30, and a head slider 50 mounted on the suspension 22. The thin film piezoelectric actuator 40 displaces the head slider 50 relative to the suspension arm 20. By virtue of the HGA 10 having the thin film piezoelectric actuator 40, the HGA 10 can move the thin film magnetic head 51 in two steps. That is, the relatively large movement of the thin film magnetic head 51 is controlled by driving the entire suspension 22 with a VCM 21, and the minute movement is controlled by driving the head slider 50 with the thin film piezoelectric actuator 40.

The suspension arm 20 is made of metal. At the tip of the suspension arm 20, a tab 26 is formed such that the head slider 50 can proceed to a slope upon evacuating itself to the ramp mechanism 9.

As shown in FIG. 3, the flexure 30 includes a flexible wiring board 37 formed by resin, such as polyimide resin, and a support plate 34 which is formed by metal, such as stainless steel, and a part of the support plate 34 is attached on the bottom of the wiring board 37. The flexure 30 is fixed to the suspension arm 20 by a technique, such as laser spot welding.

The wiring board 37 has a thin film piezoelectric actuator mounting area 36 and a head slider mounting area 38. The thin film piezoelectric actuator mounting area 36 has a shape corresponding to the shape of the thin film piezoelectric actuator 40. Specifically, the thin film piezoelectric actuator mounting area 36 includes: a first area 36a and a second area 36b which are areas at the side of the front end and in which the thin film piezoelectric actuator 40 is to be mounted; a first electrode pad 39a (first electrode), a second electrode pad 39b (second electrode), a third electrode pad 39c (third electrode), and a fourth electrode pad 39d (fourth electrode), which are for the thin film piezoelectric actuator 40 and which are at the back end side; and an electrode pad area 36c where electrode pads (not illustrated) for recording electrodes and reproduction electrodes, for example, of the head slider 50 is formed.

The first area 36a and the second area 36b have longitudinal directions that are directions along a straight line that extends from the base end side of the flexure 30 to its tip side. The first area 36a and the second area 36b are both formed such that the straight line is in between them. The first area 36a and the second area 36b are spaced apart in a direction that intersects perpendicularly with the straight line.

The head slider mounting area 38 is an area provided at the tip side of the flexure 30 compared to the first area 36a and the second area 36b in the thin film piezoelectric actuator mounting area 36. At the head slider mounting area 38, electrodes for recording (not shown) and electrodes for reproduction (not shown) are provided. They are connected to the pads for recording and the pads for reproduction of the head slider 50, respectively. The electrodes for recording and the electrodes for reproduction are electrically-connected to the electrode pads on the corresponding electrode pad area 36c by a plurality of wiring formed on the wiring board 37 using a technique, such as solder ball bonding.

At the flexure 30, a displacement transmission plate 33 is arranged apart from the head slider mounting area 38 and is arranged on an area extending from the tip of the first area 36a to the tip of the second area 36b in the thin film piezoelectric actuator mounting area 36. A rear end of the head slider 50 is mounted on the displacement transmission plate 33. The displacement transmission plate 33 is connected to a curved wing 35 which extends from the support plate 34 attached to the electrode pad area 36c in the thin film piezoelectric actuator mounting area 36 along with the outer edge of the first area 36a and the second area 36b, to thereby integrate with the support plate 34. If the thin film piezoelectric actuator 40 is mounted in the thin film piezoelectric actuator mounting area 36 and the head slider 50 is mounted in the head slider mounting area 38 and on the displacement transmission plate 33, the top surface of the displacement transmission plate 33 faces the bottom surface of the head slider 50, and the bottom surface of the displacement transmission plate 33 faces the top surface of the thin film piezoelectric actuator 40. The displacement transmission plate 33 has a function to transfer the displacement of the thin film piezoelectric actuator 40 to the head slider 50 at the time of operation of the thin film piezoelectric actuator 40. The displacement transmission plate 33 and the wing 35 are made of metal, such as stainless steel, as is the same with the support plate 34.

Figure 4:
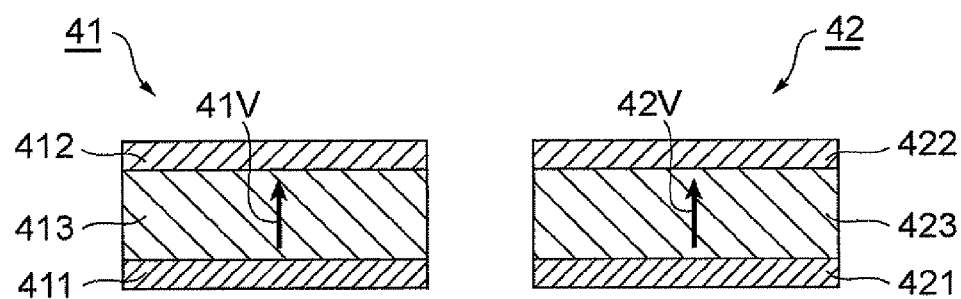
FIG. 4 is a cross-sectional view of a thin film piezoelectric actuator taken along IV-IV line in FIG. 3.

In the following, the details of the thin film piezoelectric actuator 40 will be described with reference to FIG. 3 and FIG. 4. FIG. 4 is a cross-sectional view of a thin film piezoelectric actuator taken along IV-IV line in FIG. 3.

As shown in FIG. 3, the thin film piezoelectric actuator 40 has a first piezoelectric laminate 41 and a second piezoelectric laminate 42 which are apart from each other. The first piezoelectric laminate 41 is mounted on the first area 36a in the thin film piezoelectric actuator mounting area 36, and the second piezoelectric laminate 42 is mounted on the second area 36b in the thin film piezoelectric actuator mounting area 36. Therefore, in a situation where they are both mounted in the thin film piezoelectric actuator mounting area 36, the first piezoelectric laminate 41 and the second piezoelectric laminate 42 have longitudinal directions that are directions along a straight line that extends from the base end side of the flexure 30 to the tip side, and they are spaced apart in a direction perpendicular to the straight line, that is, a direction perpendicular to their lamination directions.

Moreover, in areas other than the base end area 40R of the thin film piezoelectric actuator 40, inner sides of the first piezoelectric laminate 41 and the second piezoelectric laminate 42 that face with each other extend in parallel with each other and are spaced apart from each other. Their widths become narrower gradually as they approach from the base end area 40R to the tip side. The first piezoelectric laminate 41 and the second piezoelectric laminate 42 may be connected to each other, for example, in the base end area 40R of the thin film piezoelectric actuator 40.

At the base end area 40R of the first piezoelectric laminate 41, electrodes 41E1, 41E2 to which driving voltage is applied are provided. At the base end area 40R of the second piezoelectric laminate 42, electrodes 42E1, 42E2 to which driving voltage is applied are provided. The first piezoelectric laminate 41 and the second piezoelectric laminate 42 of the thin film piezoelectric actuator 40 are fixed to the first area 36a and the second area 36b in the thin film piezoelectric actuator mounting area 36 of the flexure 30, respectively, by adhesive bonds, such as ultraviolet curing resin. The electrodes 41E1, 41E2, 42E1, and 42E2 are electrically-connected to the first electrode pad 39a, the second electrode pad 39b, the third electrode pad 39c, and the fourth electrode pad 39d, respectively.

As shown in FIG. 4, the first piezoelectric laminate 41 is formed by laminating the first electrode layer 411, the first piezoelectric layer 413, and the second electrode layer 412, in this order. Similarly, the second piezoelectric laminate 42 is formed by laminating the third electrode layer 421, the second piezoelectric layer 423, and the fourth electrode layer 422, in this order. The first electrode layer 411, the second electrode layer 412, the third electrode layer 421, and the fourth electrode layer are all made of electrically-conductive material, and for example, they are made of metal, such as platinum (Pt), chromium (Cr), copper (Cu), nickel (Ni), gold (Au), and palladium (Pd), an alloy including at least one of these metals, and electrically-conductive ceramics, such as $SrRuO_3$, etc. The thickness of the first electrode layer 411, the second electrode layer 412, the third electrode layer 421, and the fourth electrode layer is not limited in particular, but it can be 0.01μm-2 μm, for example.

The first piezoelectric layer 413 and the second piezoelectric layer 423 are both made of piezoelectric material, and for example, they are made of ferroelectric material, such as titanic acid lead zirconate ($Pb(Zr.Ti)O_3$). The thickness of the first piezoelectric layer 413 and the second piezoelectric layer 423 is not limited in particular, but it can be 0.1 μm-10 μM, for example.

The first piezoelectric layer 413 has a first polarization vector 41V which orients to a direction from the first electrode layer 411 to the second electrode layer 412, and more specifically, the first polarization vector 41V orients to the thickness direction of the first piezoelectric layer that orients from the first electrode layer 411 to the second electrode layer 412. Although the first polarization vector 41V of the first piezoelectric layer 413 is parallel to the thickness direction of the first piezoelectric layer 413 in this embodiment, as long as the first polarization vector 41V of the first piezoelectric layer 413 has a component of the thickness direction of the first piezoelectric layer 413, it is not necessary to be parallel to the thickness direction of the first piezoelectric layer 413.

This is the same for the second piezoelectric layer 423. That is, the second piezoelectric layer 423 has a second polarization vector 42V which orients to a direction from the third electrode layer 421 to the fourth electrode layer 422, and more specifically, the second polarization vector 42V orients to the thickness direction of the second piezoelectric layer that orients from the third electrode layer 421 to the fourth electrode layer 422. Although the second polarization vector 42V of the second piezoelectric layer 423 is parallel to the thickness direction of the second piezoelectric layer 423 in this embodiment, as long as the second polarization vector 42V of the second piezoelectric layer 423 has a component of the thickness direction of the second piezoelectric layer 423, it is not necessary to be parallel to the thickness direction of the second piezoelectric layer 423. In this embodiment, the first polarization vector 41V and the second polarization vector 42V are parallel.

The first piezoelectric layer 413 and the second piezoelectric layer 423 may consist of a plurality of polarization domains. In this case, the first polarization vector 41V of the first piezoelectric layer 413 is made by composing the polarization vectors for each polarization domain of the first piezoelectric layer 413, and the second polarization vector 42V of the second piezoelectric layer 423 is made by composing the polarization vectors for each polarization domain of the second piezoelectric layer 423.

The electrodes 41E1, 41E2, 42E1, and 42E2 are electrically-connected to the first electrode layer 411, the second electrode layer 412, the third electrode layer 421, and the fourth electrode layer 422, respectively, through contact holes and the like. As will be described in detail later, the electrode pad 39a, the second electrode pad 39b, the third electrode pad 39c, and the fourth electrode pad 39d are all electrically-connected to a power source 11 for driving the thin film piezoelectric actuator 40 through the switch 15 (refer to FIG. 1).

In the following, a method for manufacturing an HGA and a method for manufacturing a hard disk drive in accordance with this embodiment will be described.

Figure 5:
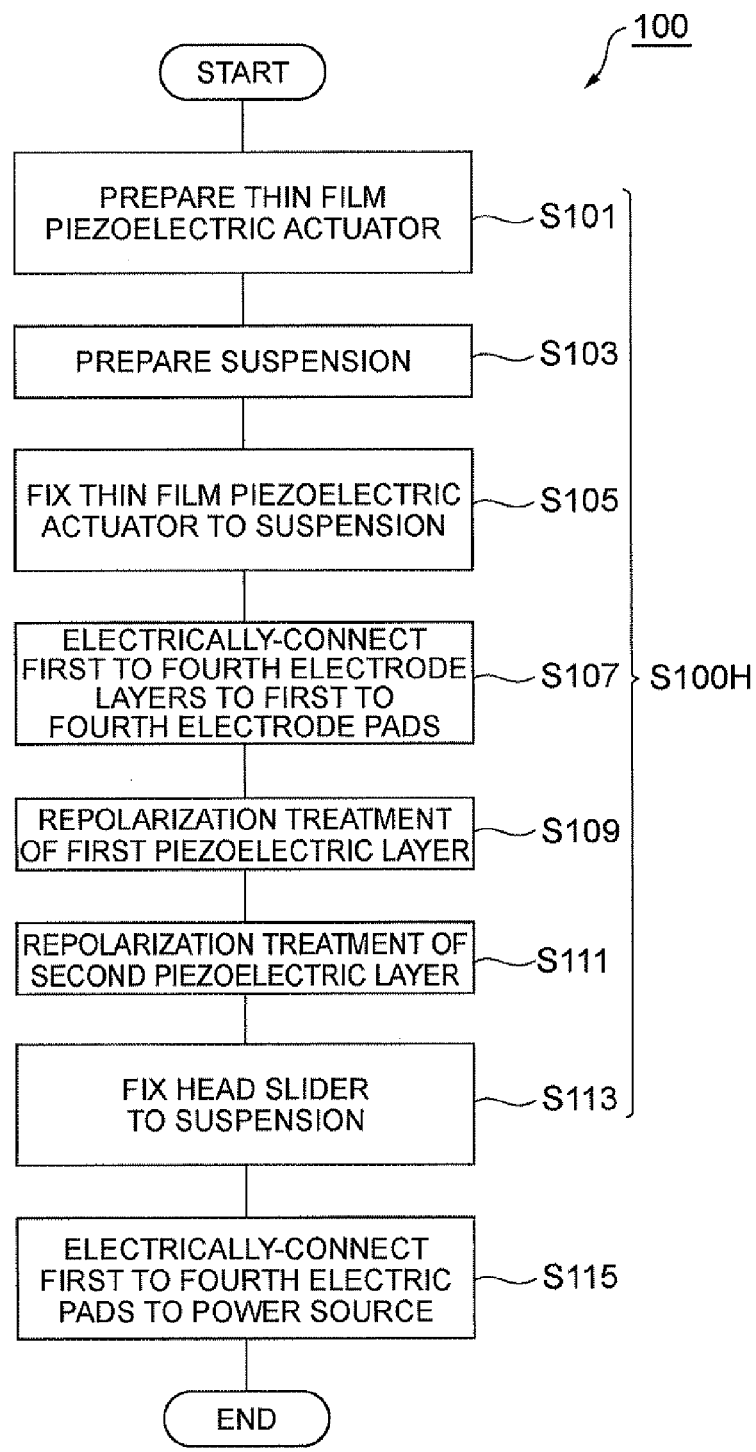
FIG. 5 is a flow chart showing a method for manufacturing an HGA in accordance with the first embodiment and a method for manufacturing a hard disk drive.

FIG. 5 is a flow chart showing a method for manufacturing an HGA and a method for manufacturing a hard disk drive in accordance with this embodiment.

As shown in the flow chart 100 in FIG. 5, the method for manufacturing the hard disk drive in accordance with the present embodiment is mainly comprised of an HGA manufacturing step S100H, and a power source connecting step S115 for electrically-connecting the electrode pad 39a, the second electrode pad 39b, the third electrode pad 39c, the fourth electrode pad 39d to the power source. The HGA manufacturing step S100H is mainly comprised of an actuator preparation step S101 for preparing the thin film piezoelectric actuator 40; a suspension preparation step S103 for preparing the suspension 22; a fixing step S105 for fixing the thin film piezoelectric actuator 40 to the suspension 22; an electrical connecting step S107 for electrically-connecting the first to fourth electrode layers 411, 412, 421, and 422 to the electrode pad 39a, the second electrode pad 39b, the third electrode pad 39c, and the fourth electrode pad 39d, respectively; a first repolarization treatment step S109 for performing repolarization treatment to the first piezoelectric layer 413; a second repolarization treatment step S111 for performing repolarization treatment to the second piezoelectric layer 423; and a fixing step S113 for fixing the head slider to the suspension.

Actuator Preparation Step and Suspension Preparation Step

In the actuator preparation step S101 and the suspension preparation step S103, an actuator 40 and a suspension 22, such as described above, are prepared, respectively (refer to FIG. 1, FIG. 2, and FIG. 3).

Fixing Step

Figure 6:
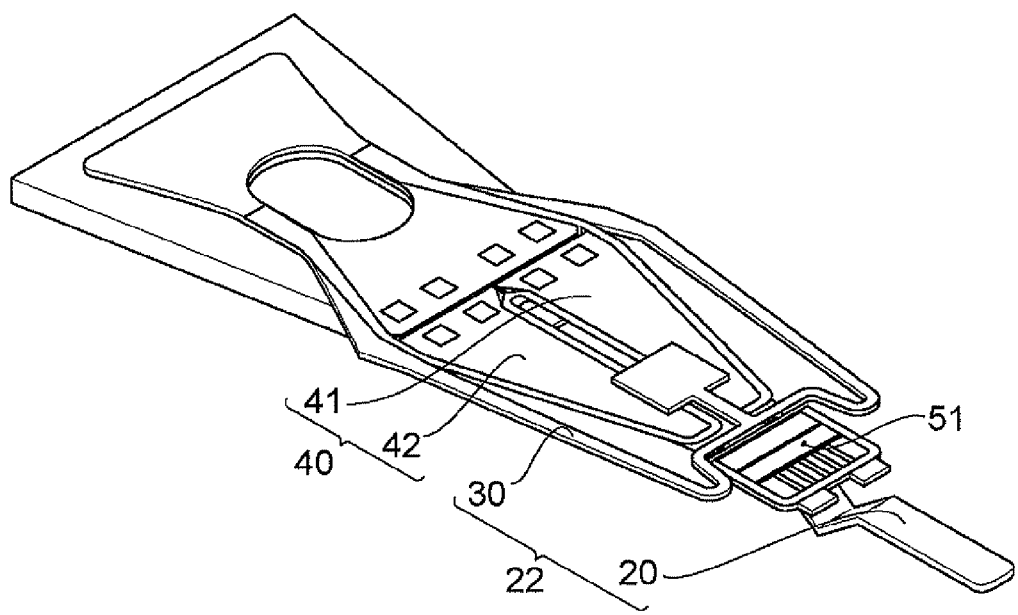
FIG. 6 is a perspective view for illustrating a fixing step.

FIG. 6 is a perspective view for illustrating the fixing step. As shown in FIG. 6, in the fixing step S105, the first piezoelectric laminate 41 of the thin film piezoelectric actuator 40 is fixed to the first area 36a in the thin film piezoelectric actuator mounting area 36 (refer to FIG. 3), and the second piezoelectric laminate 42 of the thin film piezoelectric actuator 40 is fixed to the second area 36b in the thin film piezoelectric actuator mounting area 36 (refer to FIG. 3), for example, with an adhesive bond, and thereby, the thin film piezoelectric actuator 40 is fixed to the suspension 22.

Figure 7:
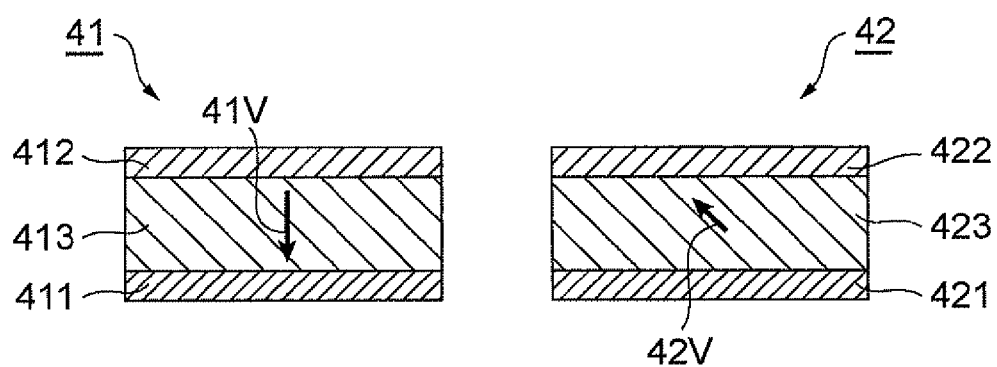
FIG. 7 is a cross-sectional view of the thin film piezoelectric actuator immediately after the fixing step.

FIG. 7 is a cross-sectional view of the thin film piezoelectric actuator immediately after the fixing step. Upon fixing the thin film piezoelectric actuator 40 to the suspension 22, the first piezoelectric layer 413 and the second piezoelectric layer 423 of the thin film piezoelectric actuator 40 may be subjected to stress. In this case, an electric field is generated by a positive piezoelectric effect in the first piezoelectric layer 413 and the second piezoelectric layer 423. If such an electric field is generated, the direction of the piezoelectric polarization of the first piezoelectric layer 413 and the second piezoelectric layer 423 may fluctuate or may be reversed. That is, if the thin film piezoelectric actuator 40 is fixed to the suspension 22, for example, with an adhesive bond, the first piezoelectric layer 413 and the second piezoelectric layer 423 are deformed. This deformation causes the orientation of the ionic displacement in the crystals of the first piezoelectric layer 413 and the second piezoelectric layer 423 to change, and influences on the spontaneous polarization of the first piezoelectric layer 413 and second piezoelectric layer 423, which are oriented.

As a result, the first polarization vector 41V and/or the second polarization vector 42V change its/their orientation and size. The magnitude of this change is dependent on the stress subjected to the first piezoelectric layer 413 and the second piezoelectric layer 423, as well as the characteristic of the first piezoelectric layer 413 and the second piezoelectric layer 423, such as film rigidity and magnitude of spontaneous polarization. In the example in FIG. 7, the first polarization vector 41V is reversed, and the magnitude of the second polarization vector 42V is changed smaller. If the first polarization vector 41V and/or the second polarization vector 42V remain changed as such, the thin film piezoelectric actuator 40 does not operate as desired, and therefore, there are cases where the characteristic of the thin film piezoelectric actuator 40 is reduced.

Electrical Connecting Step

Figure 8:
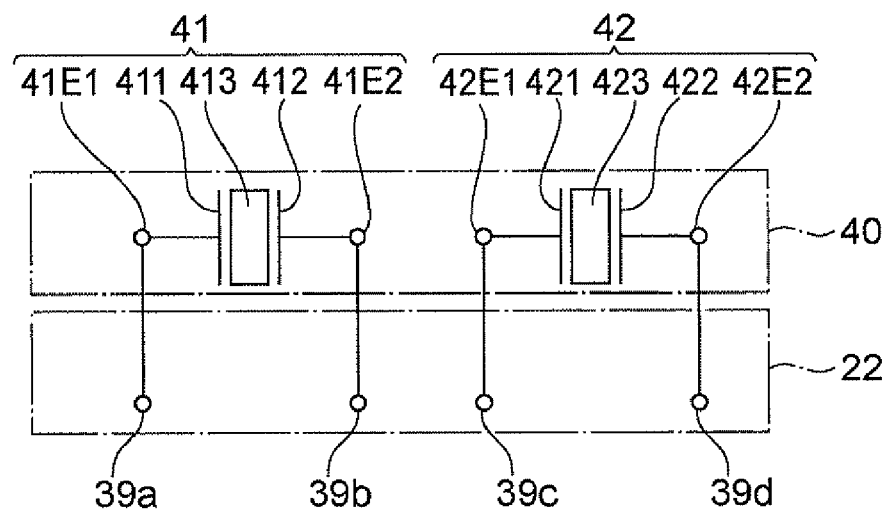
FIG. 8 is an electric wiring diagram for illustrating an electrical connecting step.

FIG. 8 is an electric wiring diagram for illustrating the electrical connecting step. As shown in FIG. 8, in the electrical connecting step S107, the electrodes 41E1, 41E2 of the first piezoelectric laminate 41 and the electrodes 42E1, 42E2 of the second piezoelectric laminate 42 are electrically-connected to the first electrode pad 39a, the second electrode pad 39b, the third electrode pad 39c, and the fourth electrode pad 39d of the suspension 22, respectively. The electrical connection can be made by solder ball bonding, for example. In the HGA 10 in accordance with the present embodiment, the electrodes 41E1, 41E2, 42E1, and 42E2 are not electrically-conductive with each other, and the electrode pad 39a, the second electrode pad 39b, the third electrode pad 39c, and the fourth electrode pad 39d are also not electrically-conductive with each other, and therefore, the first electrode layer 411, the second electrode layer 412, the third electrode layer 421, and the fourth electrode layer 422 are not electrically-conductive with each other.

First Repolarization Treatment Step and Second Repolarization Treatment Step

Figure 9:
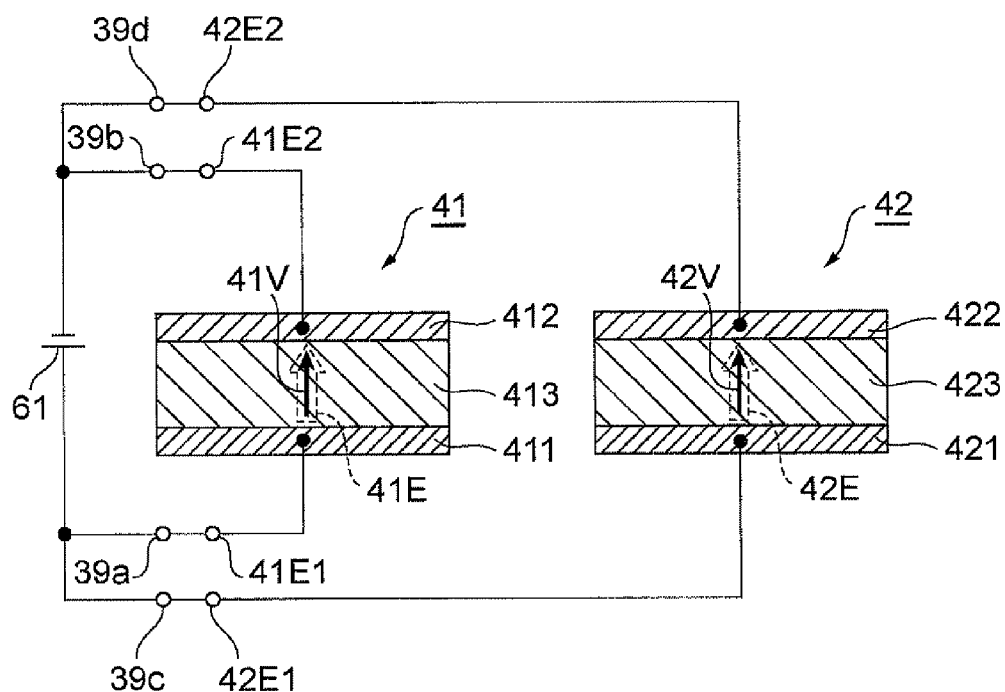
FIG. 9 is an electric wiring diagram for illustrating a first repolarization treatment step and a second repolarization treatment step.

FIG. 9 is an electric wiring diagram for illustrating the first repolarization treatment step and the second repolarization treatment step. As shown in FIG. 9, in the first repolarization treatment step S109 and the second repolarization treatment step S111, the repolarization treatment of the first piezoelectric layer 413 and the second piezoelectric layer 423 is performed using a power source 61. Specifically, the positive terminal of the power source 61 is electrically-connected to the first electrode pad 39a and the third electrode pad 39c, and also the negative terminal of the power source 61 is electrically-connected to the second electrode pad 39b and the fourth electrode pad 39d.

Therefore, an electric field 41E, which has a direction that orients from the first electrode layer 411 to the second electrode layer 412, is generated in the first piezoelectric layer 413, and the situation of the first polarization vector 41V restores to the situation before the fixing step S105 is performed or approaches to that situation. Thus, the first piezoelectric layer 413 is subjected to the repolarization treatment. In the viewpoint of effectively performing the repolarization treatment of the first piezoelectric layer 413, it is desirable to have the magnitude of the electric field 41E larger than the coercive electric field of the material that constructs the first piezoelectric layer 413. The magnitude of the electric field 41E is suitably adjusted in accordance with the magnitude of stress applied to the first piezoelectric layer 413 and the intensity of the ionic displacement of the first piezoelectric layer 413. Upon performing the repolarization treatment of the first piezoelectric layer 413, since the first electrode layer 411, the second electrode layer 412, the third electrode layer 421, and the fourth electrode layer 422 are not electrically-conductive with each other in this embodiment, an electrical field that has an orientation opposite from the direction that orients from the third electrode layer 421 to the fourth electrode layer 422 is not generated in the second piezoelectric layer 423, and therefore, the orientation of the piezoelectric polarization of the second piezoelectric layer 423 is not further fluctuated or reversed.

Repolarization treatment of the second piezoelectric layer 423 is also performed simultaneously with the repolarization treatment of the first piezoelectric layer 413. That is, an electric field 42E having a direction that orients from the third electrode layer 421 to the fourth electrode layer 422 is generated in the second piezoelectric layer 423, and the situation of the second polarization vector 42V restores to the situation before the fixing step S105 is performed or approaches to that situation. Thus, the second piezoelectric layer 423 is subjected to the repolarization treatment also. In the viewpoint of effectively performing the repolarization treatment of the second piezoelectric layer 423, it is preferable that the magnitude of the electric field 42E is larger than the coercive electric field of the material of which the second piezoelectric layer 423 is made. The magnitude of the electric field 42E is suitably adjusted in accordance with the magnitude of stress subjected to the second piezoelectric layer 423 and the intensity of the ionic displacement of the second piezoelectric layer 423. Moreover, since the first electrode layer 411, the second electrode layer 412, the third electrode layer 421, and the fourth electrode layer 422 are not electrically-conductive with each other in this embodiment when the second piezoelectric layer 423 is subjected to the repolarization treatment, an electric field opposite to the direction orienting from the first electrode layer 411 to the second electrode layer 412 is not generated in the first piezoelectric layer 413, and therefore, the direction of the piezoelectric polarization of the first piezoelectric layer 413 is not fluctuated and is not reversed.

As described above, repolarization treatment means to restore ionic displacement in the first piezoelectric layer 413 (or the second piezoelectric layer 423) to the original state, or to make it closer to the original state, by applying the electric field 41E (or electric field 42E) to the first piezoelectric layer 413 (or the second piezoelectric layer 423). By performing such repolarization treatment, the shape of the first piezoelectric layer 413 (or the second piezoelectric layer 423) which had been deformed restores or approaches to the original form.

The first repolarization treatment step S109 and the second repolarization treatment step S111 are performed simultaneously in this embodiment. However, they may be performed separately. In this embodiment, the first repolarization treatment step S109 and the second repolarization treatment step S111 are performed after the electrical connecting step S107. However, the first repolarization treatment step S109 and the second repolarization treatment step S111 may be performed before the electrical connecting step S107. In this case, the repolarization treatment of the first piezoelectric layer 413 can be performed by electrically-connecting the positive terminal of the power source 61 to the electrode 41E1 and the negative terminal to the electrode 41E1, and the repolarization treatment of the second piezoelectric layer 423 can be performed by electrically-connecting the positive terminal of the power source 61 to the electrode 42E1 and the negative terminal to the electrode 42E2.

By performing the above steps, it is possible to obtain the HGA 10 in accordance with the present embodiment.

Power Source Connecting Step

Figure 10:
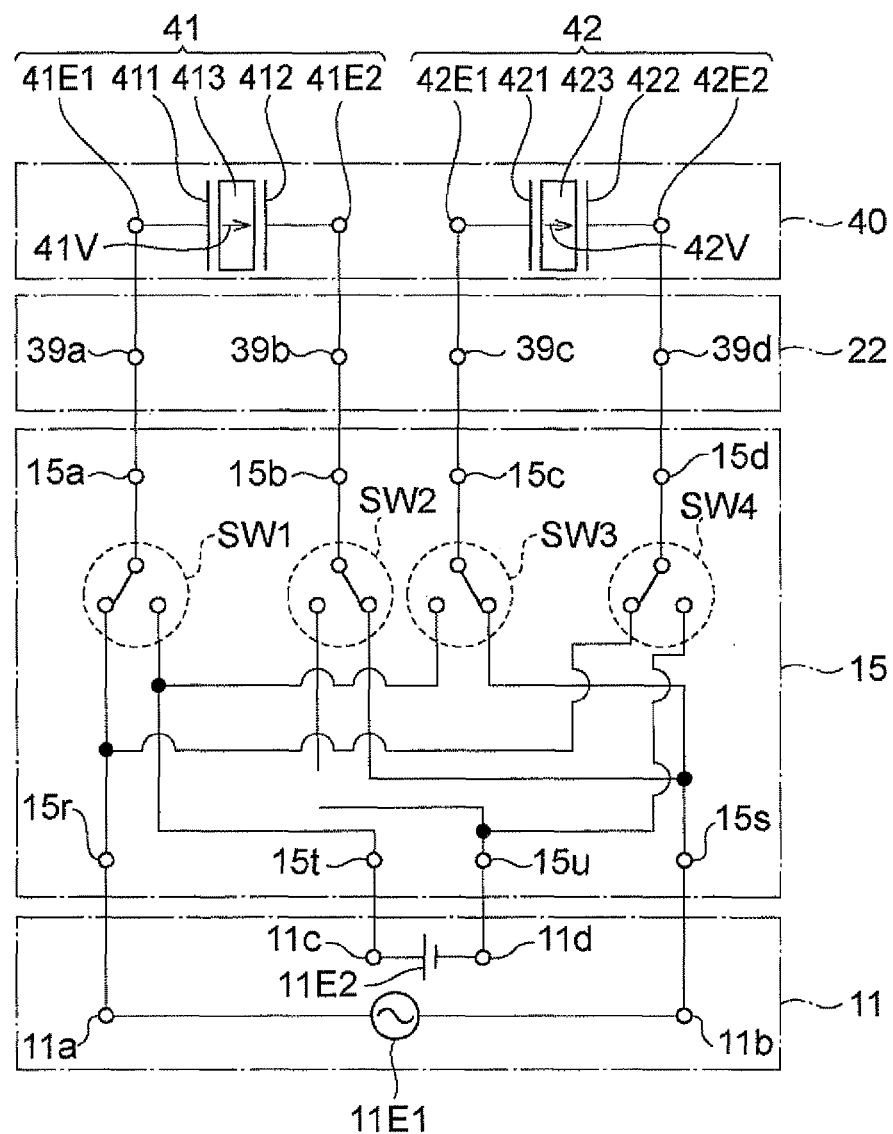
FIG. 10 is an electric wiring diagram for illustrating a power source connecting step.

FIG. 10 is an electric wiring diagram for illustrating a power source connecting step. As shown in FIG. 10, in the power source connecting step S115, the electrode pad 39a, the second electrode pad 39b, the third electrode pad 39c, and the fourth electrode pad 39d are electrically-connected to the thin film piezoelectric actuator driving power source 11E1 of the power source 11, respectively, via the switch 15.

The power source 11 includes two output terminals 11a and 11b connected to the thin film piezoelectric actuator driving power source 11E1, the repolarization treatment power source 11E2, and the thin film piezoelectric actuator driving power source 11E1, and two output terminals 11c and 11d connected to the repolarization treatment power source 11E2. In this embodiment, the repolarization treatment power source 11E2 is a DC power supply, and its positive terminal and its negative terminal are connected to the output terminal 11c and the output terminal 11d, respectively.

The switch 15 has four input terminals 15r, 15s, 15t, and 15u and four output terminals 15a, 15b, 15c, and 15d. A switching device SW1 is connected to the output terminal 15a, and the counterpart to connect the output terminal 15a can be switched to either of the input terminal 15r or the input terminal 15t using the switching device SW1. Similarly, a switching device SW2 is connected to the output terminal 15b, and the counterpart to connect the output terminal 15b can be switched to either of the input terminal 15s or the input terminal 15u using the switching device SW2. A switching device SW3 is connected to the output terminal 15c, and the counterpart to connect the output terminal 15c can be switched to either the input terminal 15s or the input terminal 15t using the switching device SW3. A switching device SW4 is connected to the output terminal 15d, and the counterpart to connect the output terminal 15d can be switched to either of the input terminal 15r or the input terminal 15u by using the switching device SW4.

The switch 15 has a function to switch the electrical connection relationship of the electrode pad 39a, the second electrode pad 39b, the third electrode pad 39c, the fourth electrode pad 39d to the power source 11 reversibly between the two states. FIG. 10 shows an electric wiring diagram in the case where the electrical connection relationship is in a first state. If the electrical connection relationship is in the first state, the output terminal 15a and the output terminal 15d are connected to the input terminal 15r, and the output terminal 15b and the output terminal 15c are both connected to the input terminal 15s.

In the power source connecting step S115, the electrode pad 39a, the second electrode pad 39b, the third electrode pad 39c and the fourth electrode pad 39d are electrically-connected to the output terminals 15a, 15b, 15c, and 15d, respectively, the input terminal 15r and input terminal 15s are electrically-connected to the output terminal 11a and the output terminal 11b, respectively, and the input terminal 15t and the input terminal 15u are electrically-connected to the output terminal 11c and the output terminal 11d, respectively. Thereby, the first electrode pad 39a and the fourth electrode pad 39d are electrically-connected to the output terminal 11a of the power source 11, and the second electrode pad 39b and the third electrode pad 39c are electrically-connected to the output terminal 11b of the power source 11 as well.

After this step, the HGA 10 is assembled with a case 3, a hard disk 5, a control unit 7, a ramp mechanism 9, etc., completing the hard disk unit 1 in accordance with the present embodiment as shown in FIG. 1.

As shown in FIG. 10, if the electrical connection relationship of the first electrode pad 39a, the second electrode pad 39b, the third electrode pad 39c, and the fourth electrode pad 39d, to the power source 11 is in the first state, it is possible to expand and contract the first piezoelectric layer 413 and the second piezoelectric layer 423 by the thin film piezoelectric actuator driving power source 11E1, with the two layers being opposite phase with each other. For example, if voltage is applied between the output terminal 11a and the output terminal 11b from the thin film piezoelectric actuator driving power source 11E1 such that the output terminal 11a has positive electric potential and the output terminal 11b has negative electrical potential, voltage having the same direction with the first polarization vector 41V is applied to the first piezoelectric layer 413 and voltage having an opposite direction with the second polarization vector 42V is applied to the second piezoelectric layer 423. Therefore, the first piezoelectric layer 413 expands in its thickness direction (that is, it contracts in its in-plane direction), and the second piezoelectric layer 423 contracts in its thickness direction (that is, it expands in its in-plane direction).

Moreover, if voltage is applied between the output terminal 11a and the output terminal 11b from the thin film piezoelectric actuator driving power source 11E1 such that the output terminal 11a has negative electrical potential and the output terminal 11b has positive electric potential, the first piezoelectric layer 413 contracts in its thickness direction (that is, it expands in its in-plane direction), and the second piezoelectric layer 423 expands in its thickness direction (that is, it contracts in its in-plane direction). Thus, the range of voltage applied between the output terminal 11a and the output terminal 11b upon expanding and contracting the first piezoelectric layer 413 and the second piezoelectric layer 423 is adjusted such that the maximum of the magnitude of the electric field produced in the first piezoelectric layer 413 and in the second piezoelectric layer 423 is smaller than the coercive electric field of the material of the first piezoelectric layer 413 and the second piezoelectric layer 423.

In a situation where the first piezoelectric laminate 41 and the second piezoelectric laminate 42 are both mounted in the thin film piezoelectric actuator mounting area 36, directions along straight lines that extend from the base end side to the tip side of the flexure 30 are longitudinal directions of the first piezoelectric laminate 41 and the second piezoelectric laminate 42 (refer to FIG. 3). Therefore, the first piezoelectric laminate 41 and the second piezoelectric laminate 42 expand and contract especially largely in their longitudinal directions. Thus, if voltage is applied between the output terminal 11a and the output terminal 11b from the thin film piezoelectric actuator driving power source 11E1 such that, for example, the output terminal 11a has positive electric potential and the output terminal 11b has negative electrical potential, the first piezoelectric laminate 41 contracts especially large in the direction of an arrow A1 in FIG. 3, and the second piezoelectric laminate 42 expands especially in the direction of an arrow A2 in FIG. 3.

Moreover, if voltage is applied between the output terminal 11a and the output terminal 11b from the thin film piezoelectric actuator driving power source 11E1 such that the output terminal 11a has negative electrical potential and the output terminal 11b has positive electric potential, the first piezoelectric laminate 41 expands especially large in an opposite direction to the direction of the arrow A1 in FIG. 3, and the second piezoelectric laminate 42 contracts especially large in an opposite direction to the direction of the arrow A2 in FIG. 3.

Such displacements of the first piezoelectric laminate 41 and the second piezoelectric laminate 42 are transmitted to the head slider 50 by the displacement transmission plate 33. Therefore, it is possible to displace the head slider 50 in a track width direction by the thin film piezoelectric actuator 40. At the time of the operation of the hard disk unit 1, based on the position information read from the hard disk 5, the thin film magnetic head 51 changes appropriately the magnitude and polarity of voltage that is applied to the thin film piezoelectric actuator 40 by the thin film piezoelectric actuator driving power source 11E1. Therefore, it is possible to continuously maintain the head slider 50 at a suitable position. For example, the shape of the voltage signal applied from the thin film piezoelectric actuator driving power source 11E1 to the thin film piezoelectric actuator 40 may be rectangular-shaped and changes the polarity with time. Moreover, in this embodiment, since the first piezoelectric laminate 41 and the second piezoelectric laminate 42 are displaced in opposite phase with each other as described above, it is possible to enlarge the displacement range of the head slider 50.

Figure 11:
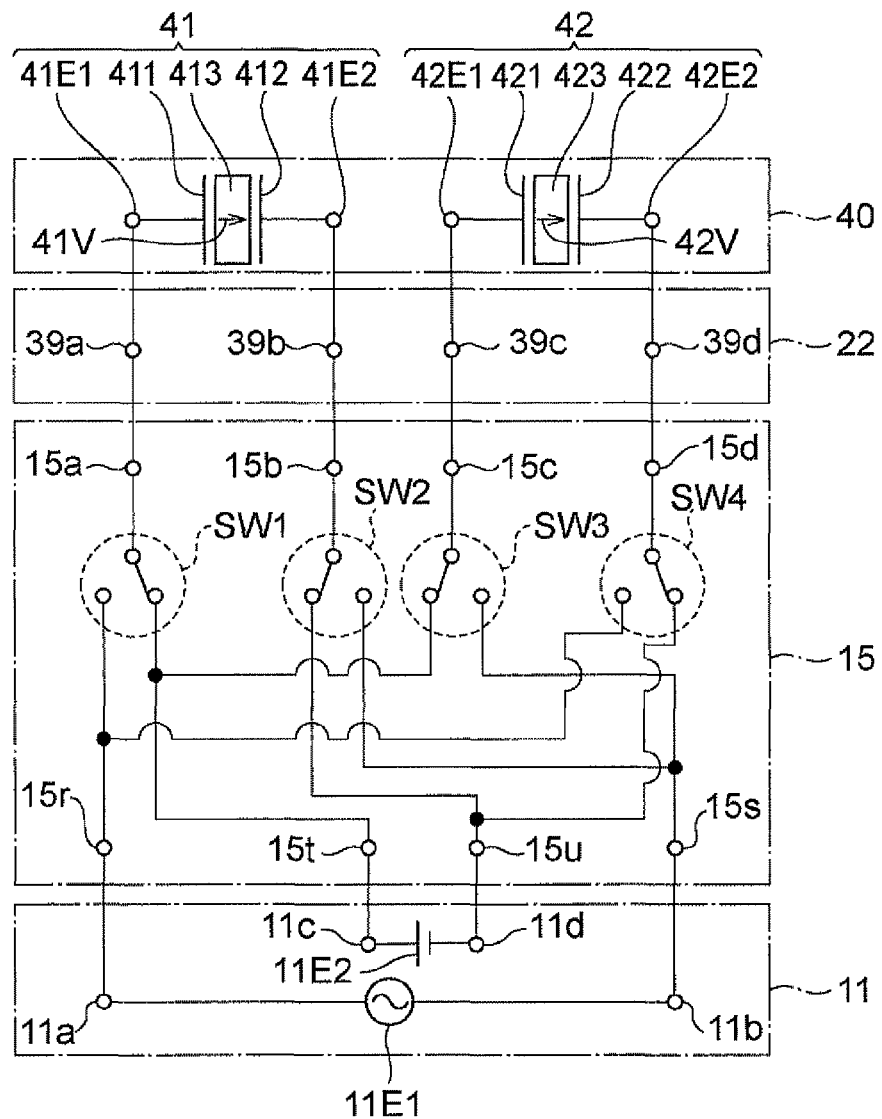
FIG. 11 is an electric wiring diagram for illustrating the power source connecting step.

FIG. 11 is an electric wiring diagram in the case where the electrical connection relationship between the first to fourth electrode pads and the power source is switched to a second state with a switch. As shown in FIG. 11, in the second state, by switching the switching devices SW1, SW2, SW3, and SW4, the output terminal 15a and the output terminal 15c are both electrically-connected to the input terminal 15t, and the output terminal 15b and the output terminal 15d are both electrically-connected to the input terminal 15u.

Even if it is after completing the assembly of the hard disk unit 1, due to reasons such as polarization fatigue at the time of continuing the drive of the thin film piezoelectric actuator 40, the direction of the piezoelectric polarization of the first piezoelectric layer 413 or the second piezoelectric layer 423 may fluctuate or may be reversed during the operation of the hard disk unit 1, to thereby worsen the characteristic of the thin film piezoelectric actuator 40. However, in the case of the second state shown in FIG. 11, it is possible to subject the first piezoelectric layer 413 or the second piezoelectric layer 423 which are in such a state to the repolarization treatment by the repolarization treatment power source 11E2.

Specifically, direct current voltage is applied between the input terminal 15t and the input terminal 15u by the repolarization treatment power source 11E2, and thereby, the electric field having a direction that orients from the first electrode layer 411 to the second electrode layer 412 is generated in the first piezoelectric layer 413, and the electric field having a direction that orients from the third electrode layer 421 to the fourth electrode layer 422 is generated in the second piezoelectric layer 423. At this time, it is desirable to generate an electric field larger than the coercive electric field of the material of the first piezoelectric layer 413 in the first piezoelectric layer 413, and to generate an electric field larger than the coercive electric field of the material of the second piezoelectric layer 423 in the second piezoelectric layer 423. Therefore, it is possible to restore the directions of the polarization of the first piezoelectric layer 413 and the second piezoelectric layer 423 to the original state, or to make them approach to the original state. Therefore, even if the characteristic of the thin film piezoelectric actuator 40 is reduced due to reasons such as the polarization fatigue of the hard disk unit 1 in use, it is possible to recover this characteristic easily.

In accordance with the method for manufacturing the HGA 10 of the present embodiment, it is possible to obtain a thin film piezoelectric actuator 40 including a pair of piezoelectric laminates (first piezoelectric laminate 41 and second piezoelectric laminate 42) each having a monolayer piezoelectric layer (first piezoelectric layer 413 and second piezoelectric layer 423), that is, an HGA 10 including a monolayer type thin film piezoelectric actuator 40 (refer to FIG. 3 and FIG. 4).

Furthermore, in accordance with the method for manufacturing the HGA 10 of the present embodiment, after fixing the thin film piezoelectric actuator 40 to the suspension 22, both the first piezoelectric layer 413 and the second piezoelectric layer 423 are subjected to the repolarization treatment (refer to FIG. 9). Therefore, upon fixing the thin film piezoelectric actuator 40 to the suspension 22, even if the thin film piezoelectric actuator 40 is subjected to stress, and an electric field is generated in the first piezoelectric layer 413 and the second piezoelectric layer 423 by a positive piezoelectric effect, and thus, the directions of the piezoelectric polarization of the first piezoelectric layer 413 and the second piezoelectric layer 423 is fluctuated or is reversed by such an electric field, it is possible to restore the directions of the piezoelectric polarization of the first piezoelectric layer 413 and the second piezoelectric layer 423 to their original state or to make them approach to their original state (refer to FIG. 7 and FIG. 9). As a result, it is possible to suppress the characteristic reduction of the thin film piezoelectric actuator 40 resulting from the directions of the piezoelectric polarization fluctuating or being reversed.

Moreover, in accordance with the method for manufacturing the hard disk unit 1 of the present embodiment, it is possible to suppress the characteristic reduction of the thin film piezoelectric actuator 40 resulting from the direction of the piezoelectric polarization of the first piezoelectric layer 413 and the second piezoelectric layer 423 fluctuating or being reversed upon fixing the thin film piezoelectric actuator 40 to the suspension 22.

The HGA 10 in accordance with the present embodiment is an HGA 10 comprised of a thin film piezoelectric actuator including a pair of piezoelectric laminates (first piezoelectric laminate 41 and second piezoelectric laminate 42) each having a monolayer piezoelectric layer (first piezoelectric layer 413 and second piezoelectric layer 423), that is, an HGA 10 comprised of the monolayer type thin film piezoelectric actuator 40 (refer to FIG. 3 and FIG. 4).

Furthermore, in the HGA 10 in accordance with the present embodiment, the first electrode layer 411, the second electrode layer 412, the third electrode layer 421, and the fourth electrode layer 422 are not electrically-conductive with each other, and the first electrode pad 39a, the second electrode pad 39b, the third electrode pad 39c, and the fourth electrode pad 39d are also not electrically-conductive with each other (refer to FIG. 3 and FIG. 8). Therefore, in accordance with the HGA 10 of the present embodiment, even if the thin film piezoelectric actuator 40 is subjected to stress at the time such as when fixing the thin film piezoelectric actuator 40 to the suspension 22, an electric field is generated in the first piezoelectric layer 413 and the second piezoelectric layer 423 by a positive piezoelectric effect, and the direction of the piezoelectric polarization of the first piezoelectric layer 413 and the second piezoelectric layer 423 is fluctuated or is reversed with this electric field, it is possible to apply voltage between the first electrode layer 411 and the second electrode layer 412 such that an electric field having a direction that orients from the first electrode layer 411 to the second electrode layer 412 is generated in the first piezoelectric layer 413, and to apply voltage between the third electrode layer 421 and the fourth electrode layer 422 such that an electric field having a direction that orients from the third electrode layer 421 to the fourth electrode layer 422 is generated in the second piezoelectric layer 423.

Therefore, it is possible to restore the directions of the piezoelectric polarization of the first piezoelectric layer 413 and the second piezoelectric layer 423 to the original state, or to make them approach to the original state. As a result, it is possible to suppress the characteristic reduction of the thin film piezoelectric actuator 40 resulting from the direction of piezoelectric polarization fluctuating or being reversed.

Moreover, in accordance with the hard disk unit 1 of the present embodiment, since the hard disk unit 1 includes the HGA 10, it is possible to suppress the characteristic reduction of the thin film piezoelectric actuator 40 resulting from the direction of the piezoelectric polarization fluctuating or being reversed.

Second Embodiment

Now, a method for manufacturing an HGA in accordance with the second embodiment and a method for manufacturing a hard disk drive will be described.

Figure 12:
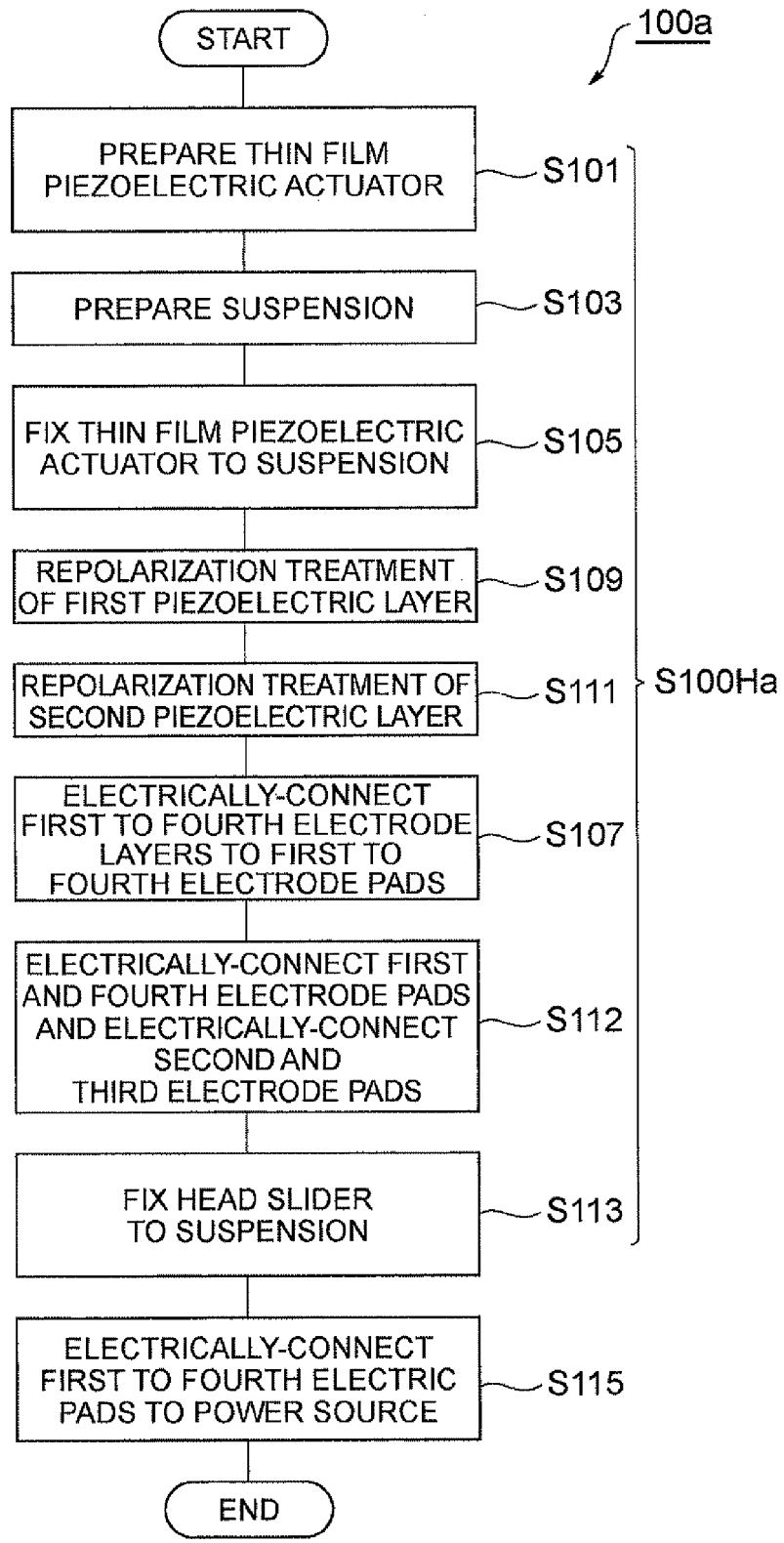
FIG. 12 is a flow chart showing a method for manufacturing an HGA in accordance with the second embodiment and a method for manufacturing a hard disk drive.

FIG. 12 is a flow chart showing the method for manufacturing an HGA and the method for manufacturing a hard disk drive in accordance with the present embodiment. As shown in the flow chart 100a in FIG. 12, the method for manufacturing the hard disk drive in accordance with the present embodiment is different from the first embodiment in that, in a HGA manufacturing step S100Ha corresponding to the HGA manufacturing step S100H of the first embodiment, the electrical connecting step S107 is performed after the first repolarization treatment step S109 and the second repolarization treatment step S111, the method further comprises an inter-electrode connecting step S112 for electrically-connecting the first electrode pad 39a to the fourth electrode pad 39d and electrically-connecting the second electrode pad 39b to the third electrode pad 39c after the electrical connecting step S107, and in the arrangement of the suspension prepared in the suspension preparation step. Moreover, the method for manufacturing the hard disk drive in accordance with the present embodiment is different from the first embodiment in that the power source does not have a switch.

Figure 13:
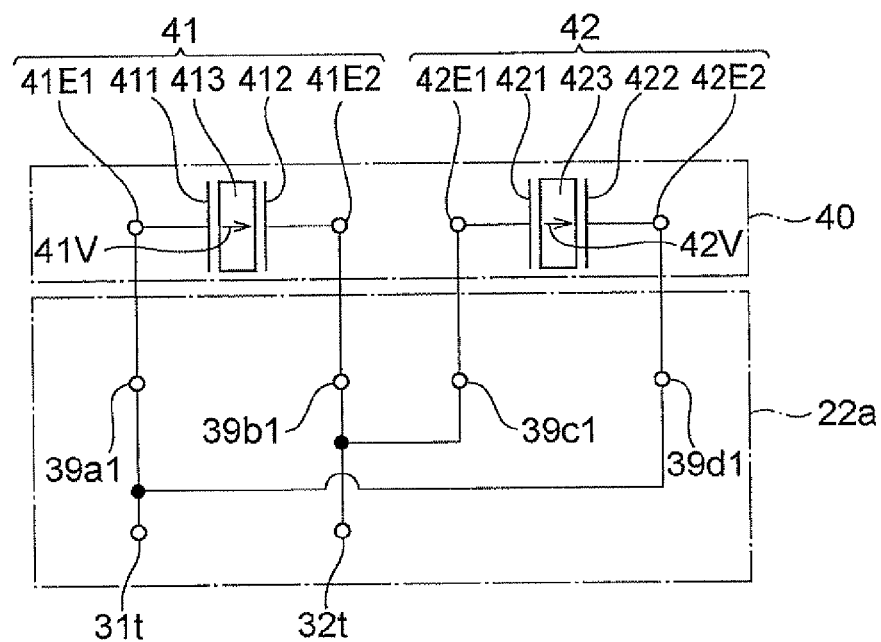
FIG. 13 is an electric wiring diagram for illustrating an inter-electrode connecting step.

FIG. 13 is an electric wiring diagram for illustrating the inter-electrode connecting step. The suspension 22a in FIG. 13 corresponds to the suspension 22 in accordance with the first embodiment. The suspension 22a of the present embodiment is different from the suspension 22 of the first embodiment in that the suspension 22a has two terminals 31t and 32t. In the inter-electrode connecting step S112, the first electrode pad 39a1 and the fourth electrode pad 39d1 corresponding to the first electrode pad 39a and the fourth electrode pad 39d, respectively, in the first embodiment are electrically-connected to the terminal 31t, and the second electrode pad 39b1 and the third electrode pad 39c1 corresponding to the second electrode pad 39b and the third electrode pad 39c, respectively, in the first embodiment are electrically-connected to the terminal 32t. Thus, the first electrode pad 39a1 and the fourth electrode pad 39d1 are electrically-connected with each other, and the second electrode pad 39b1 and the third electrode pad 39c1 are electrically-connected with each other.

Figure 14:
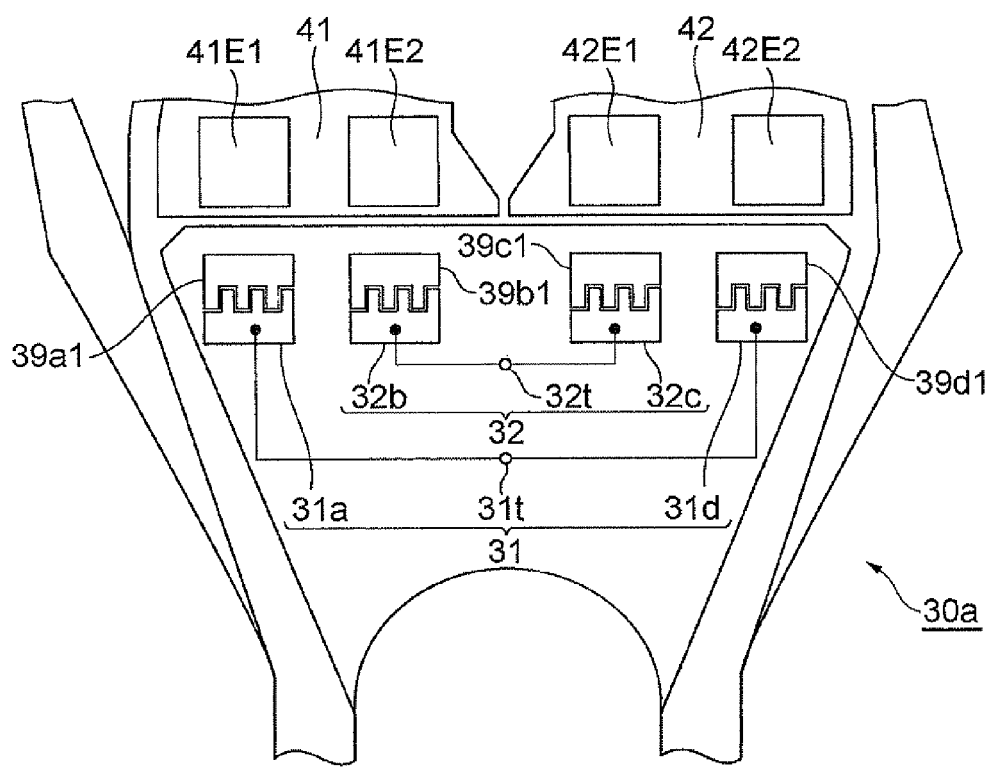
FIG. 14 is a partially enlarged plan view of a flexure immediately after the second repolarization treatment step.

A method to perform the inter-electrode connecting step S112 will be described in detail with reference to FIG. 14 and FIG. 15. FIG. 14 is a partially enlarged plan view of a flexure immediately after the second repolarization treatment step. As shown in FIG. 14, the present embodiment differs with the first embodiment in that the flexure 30a corresponding to the flexure 30 in accordance with the first embodiment has shapes of the first electrode pad 39a1, the second electrode pad 39b1, the third electrode pad 39c1, and the fourth electrode pad 39d1, and includes the first electrically-conductive member 31 and the second electrically-conductive member 32.

The first electrically-conductive member 31 has a first uneven electrode 31a and a fourth uneven electrode 31d, both having concavo-convex portions, and they are both electrically-connected to the terminal 31t. The first electrode pad 39a1 and the fourth electrode pad 39d1 each has a concavo-convex portion that has a shape corresponding to the concavo-convex portion of the first uneven electrode 31a and the fourth uneven electrode 31d, respectively. The first electrode pad 39a1 and the first uneven electrode 31a adjoin with each other such that a concave portion of one of them and a convex portion of the other one face with each other. The fourth electrode pad 39d1 and the fourth uneven electrode 31d adjoin with each other such that a concave portion of one of them and a convex portion of the other one face with each other.

The second electrically-conductive member 32 includes a second uneven electrode 32b and a third uneven electrode 32c, each having a concavo-convex portion, and they are both electrically-connected to the terminal 32t. The second electrode pad 39b1 and the third electrode pad 39c1 also have concavo-convex portions having shapes corresponding to the concavo-convex portions of the second uneven electrode 32b and the third uneven electrode 32c, respectively. The second electrode pad 39b1 and the second uneven electrode 32b adjoin with each other such that a concave portion of one of them and a convex portion of the other one face with each other. The third electrode pad 39c1 and the third uneven electrode 32c adjoin with each other such that a concave portion of one of them and a convex portion of the other one face with each other.

Figure 15:
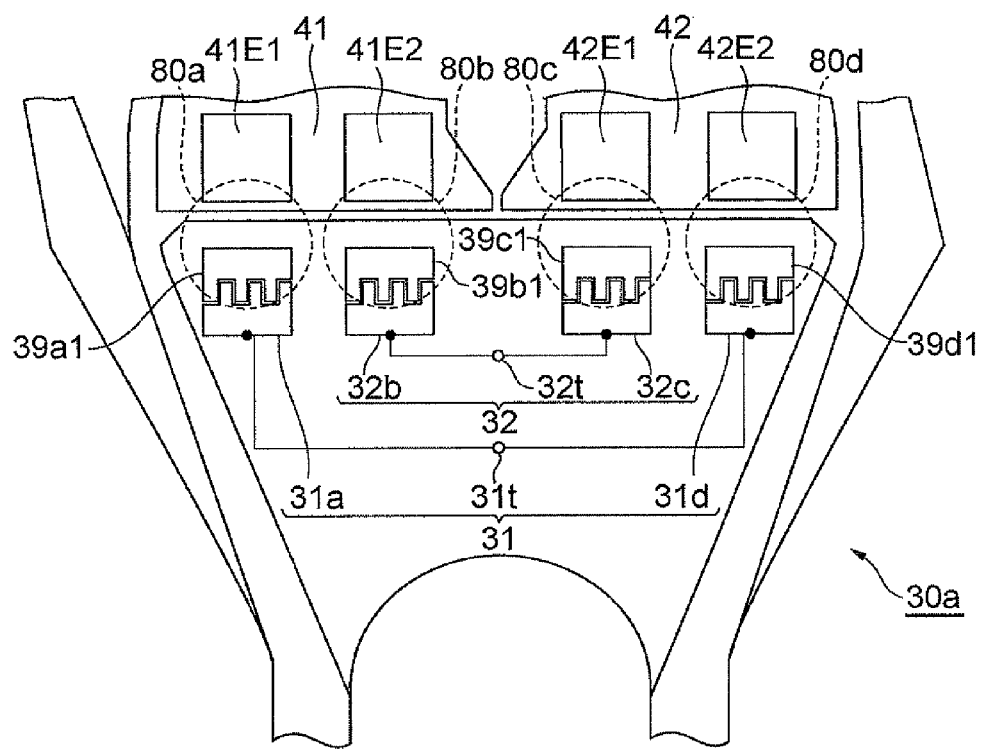
FIG. 15 is a partially enlarged plan view of the flexure for illustrating the inter-electrode connecting step.

FIG. 15 is a partially enlarged plan view of the flexure for illustrating an inter-electrode connecting step. As shown in FIG. 15, in this embodiment, the electrical connecting step S107 and the inter-electrode connecting step S112 are performed simultaneously. Specifically, the electrode 41E1, the first electrode pad 39a1, and the first uneven electrode 31a are electrically-connected by, for example, a solder ball 80a, the electrode 41E2, the second electrode pad 39b1, and the second uneven electrode 32b are electrically-connected by, for example, a solder ball 80b, the electrode 42E1, the third electrode pad 39c1, and the third uneven electrode 32c are electrically-connected by, for example, a solder ball 80c, and the electrode 42E2, the fourth electrode pad 39d1, and the fourth uneven electrode 31d are electrically-connected to by, for example, the solder ball 80d. Thus, a step for electrically-connecting the electrodes 41E1, 41E2, and the electrodes 42E1, 42E2 to the first electrode pad 39a, the second electrode pad 39b, the third electrode pad 39c, and the fourth electrode pad 39d, respectively (electrical connecting step S107), and a step for electrically-connecting the first electrode pad 39a1 and the fourth electrode pad 39d1 to the terminal 31t and for electrically-connecting the second electrode pad 39b1 and the third electrode pad 39c1 to the terminal 32t (inter-electrode connecting step) are performed simultaneously. In this embodiment, since the two steps can be performed simultaneously as described above, it is possible to simplify the manufacturing process.

The inter-electrode connecting step S112 may be performed separate from the electrical connecting step S107. In this case, the electrical connecting step S107 may be performed before the first repolarization treatment step S109 or the second repolarization treatment step S111.

Moreover, the inter-electrode connecting step S112 may be performed without using the first electrically-conductive member 31 or the second electrically-conductive member 32. Specifically, the suspension prepared in the suspension preparation step S103 may be performed as in the first embodiment (that is, the suspension may not include the first electrically-conductive member 31 or the second electrically-conductive member 32), and the first electrode pad 39a1 and the fourth electrode pad 39d1 may be electrically-connected to the terminal 31t, and also the second electrode pad 39b1 and the third electrode pad 39c1 may be connected to the terminal 32t, using conductive material, such as metal wire, solder, and conductive resin.

Figure 16:
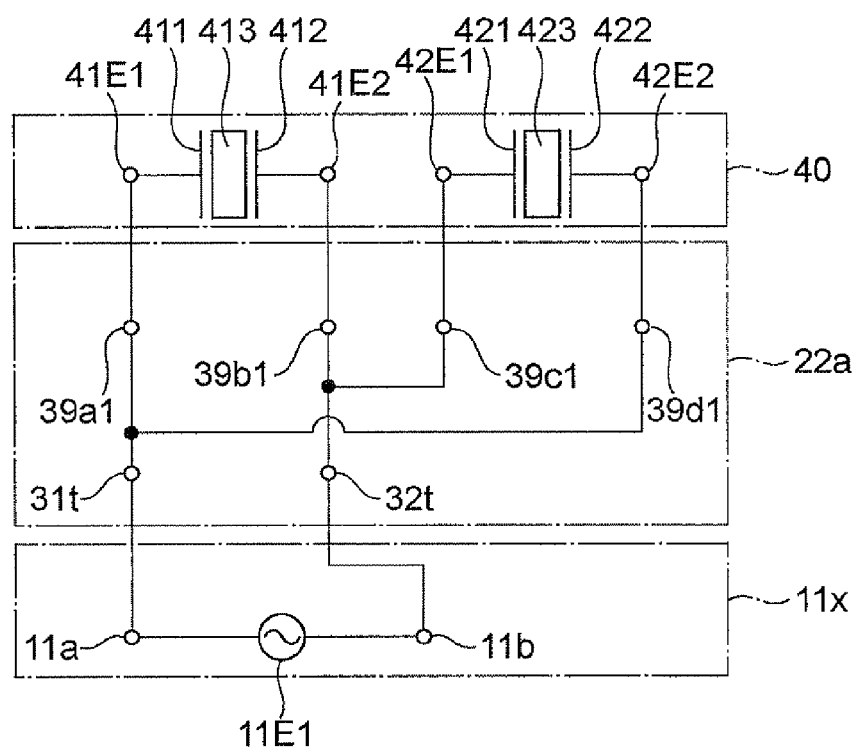
FIG. 16 is an electric wiring diagram for illustrating the power source connecting step of the second embodiment.
Figure 17:
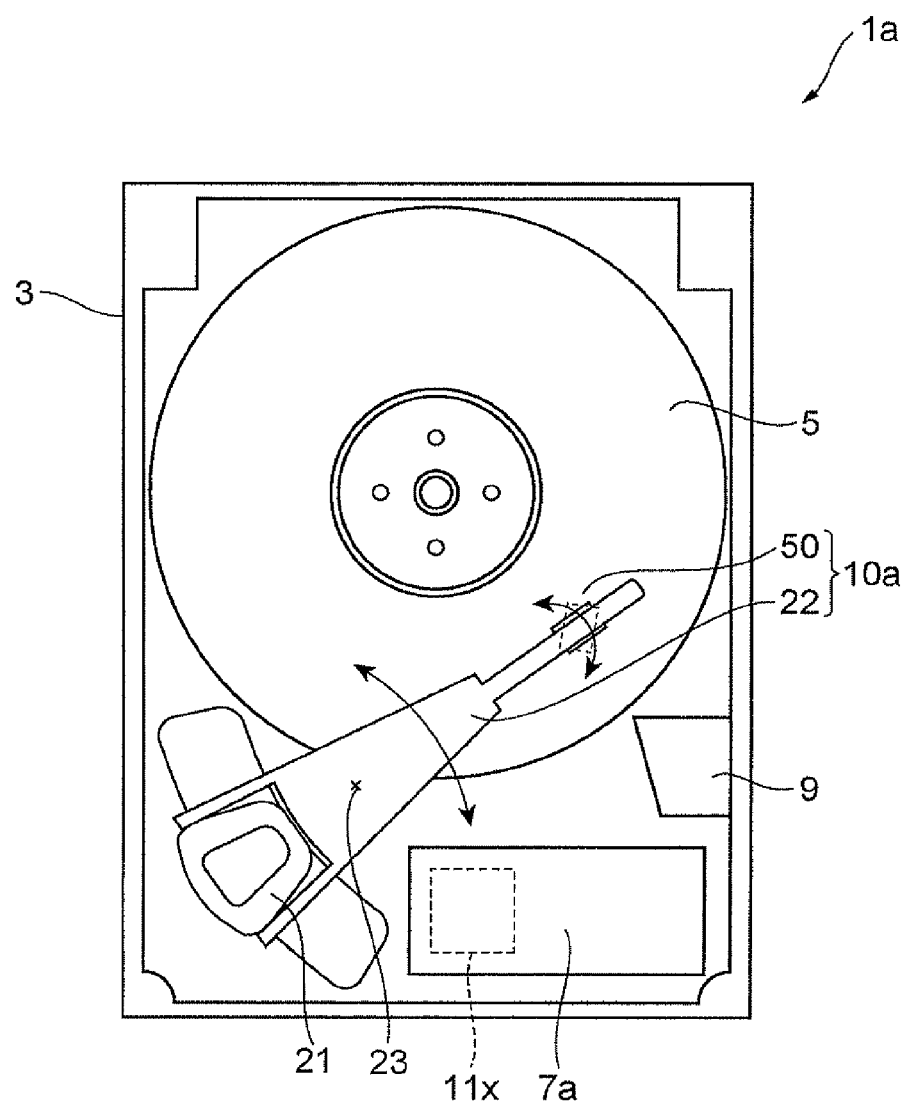
FIG. 17 is a view illustrating an HGA manufactured in accordance with the second embodiment and a hard disk drive manufactured in accordance with the second embodiment.

FIG. 16 is an electric wiring diagram for illustrating the power source connecting step in accordance with the present embodiment. In this embodiment, the power source 11x corresponding to the power source 11 in accordance with the first embodiment does not have the switch 15 (refer to FIG. 10 and FIG. 11). As shown in FIG. 16, in the power source connecting step S115, the output terminal 11a of the power source 11x and the terminal 31t are electrically-connected, and the output terminal 11b and the terminal 32t are electrically-connected, and therefore, the electrode pad 39a1, the second electrode pad 39b1, the third electrode pad 39c 1, and the fourth electrode pad 39d1 are all electrically-connected to the thin film piezoelectric actuator driving power source 11E1 of the power source 11x. FIG. 17 is a view illustrating an HGA manufactured in accordance with the present embodiment and the hard disk drive manufactured in accordance with the present embodiment. The hard disk unit 1a in FIG. 17 and the HGA 10a correspond to the hard disk unit 1 and HGA 10, respectively, in accordance with the first embodiment. The hard disk unit la is different from the first embodiment in that the control unit 7a corresponding to the control unit 7 in the first embodiment does not have the switch 15 (refer to FIG. 1, FIG. 10, and FIG. 11).

In accordance with the above-described method for manufacturing the HGA 10a in accordance with the present embodiment, because of the same reason as the case with the method for manufacturing the HGA 10 in accordance with the first embodiment, it is possible to obtain an HGA 10a including a monolayer type thin film piezoelectric actuator 40, and also to suppress the characteristic reduction of the thin film piezoelectric actuator 40 resulting from the direction of the piezoelectric polarization fluctuating or being reversed.

Furthermore, in accordance with the method for manufacturing the HGA 10a in accordance with this embodiment, the method includes the inter-electrode connecting step S112 for electrically-connecting the first electrode pad 39a1 and the fourth electrode pad 39d1, and electrically-connecting the second electrode pad 39b1 and the third electrode pad 39c1 (refer to FIG. 13), and therefore, it is possible to apply voltage to all of the first electrode pad 39a1, the second electrode pad

39*b*1, the third electrode pad 39*c*1, and the fourth electrode pad 39*d*1 only by applying voltage at two locations (terminal 31*t* and terminal 32*t*) upon operating the thin film piezoelectric actuator 40. As a result, it is possible to obtain an HGA 10*a* which can simplify the circuit configuration when used in the hard disk unit 1*a*.

Furthermore, in accordance with the method for manufacturing an HGA 10*a* in accordance with this embodiment, an electrical connection such as the above is performed in the inter-electrode connecting step S112, and therefore, it is possible to operate the thin film piezoelectric actuator 40 such that the first piezoelectric layer 413 and the second piezoelectric layer 423 expand and contract in opposite phase with each other (refer to FIG. 13 and FIG. 16). Therefore, it is possible to enlarge the displacement range of the head slider 50.

Moreover, in accordance with the method for manufacturing the hard disk unit 1*a* of the present embodiment, for the same reason as the case with the method for manufacturing the hard disk unit 1 in accordance with the first embodiment, it is possible to suppress the characteristic reduction of the thin film piezoelectric actuator 40 resulting from the direction of the piezoelectric polarization of the first piezoelectric layer 413 and the second piezoelectric layer 423 fluctuating or being reversed upon fixing the thin film piezoelectric actuator 40 to the suspension 22*a*.

The present invention is not limited to the above embodiments and various modifications are possible.

For example, in each of the above-described embodiments, the first electrode pad 39*a* (first electrode pad 39*a*1), the second electrode pad 39*b* (second electrode pad 39*b*1), the third electrode pad 39*c* (third electrode pad 39*c*1), and the fourth electrode pad 39*d* (fourth electrode pad 39*d*1) are electrically-connected to the power source 11 (power source 11*x*) such that the first piezoelectric layer 413 and the second piezoelectric layer 423 expand and contract in opposite phase with each other (refer to FIG. 10, FIG. 11, and FIG. 16). However, the electrical connection may be performed such that the first piezoelectric layer 413 and the second piezoelectric layer 423 may expand and contract in the same phase with each other. For example, in the power source connecting step S115 in accordance with the first embodiment, if the electrical connection relationship of the electrode pad 39*a*, the second electrode pad 39*b*, the third electrode pad 39*c*, and the fourth electrode pad 39*d* to the power source 11 is in the first state (refer to FIG. 10), the first electrode pad 39*a* and the third electrode pad 39*c* may be electrically-connected to the output terminal 11*a* of the power source 11, the second electrode pad 39*b* and the fourth electrode pad 39*d* may be electrically-connected with the output terminal 11*b* of the power source 11, and if the electrical connection relationship is in the second state (refer to FIG. 11), the first electrode pad 39*a* and the third electrode pad 39*c* may be electrically-connected to the output terminal 11*c* of the power source 11, and the second electrode pad 39*b* and the fourth electrode pad 39*d* may be electrically-connected to the output terminal 11*d* of the power source 11. Moreover, for example, in the inter-electrode connecting step S112 of the second embodiment, the first electrode pad 39*a*1 and the third electrode pad 39*c*1 may be electrically-connected and the second electrode pad 39*b*1 and the fourth electrode pad 39*d*1 may be electrically-connected as well.

Moreover, in the power source connecting step S115 of the first embodiment, the power source 11 may include two sets of thin film piezoelectric actuator driving power sources, and the first thin film piezoelectric actuator driving power source may be electrically-connected to the first electrode pad 39*a* and the second electrode pad 39*b*, and the second thin film piezoelectric actuator driving power source may be electrically-connected to the second electrode pad 39*b* and the fourth electrode pad 39*d*. In this case, these electrical connections may be made such that the first piezoelectric layer 413 and the second piezoelectric layer 423 expand and contract in whichever modes, in opposite phase with each other or in same phase with each other. Thereby, voltage can be applied to the first piezoelectric layer 413 and the second piezoelectric layer 423 independently using the first and second thin film piezoelectric actuator driving power sources, respectively, and therefore, it is possible to drive the head slider 50 more precisely by the thin film piezoelectric actuator 40.

Moreover, in each of the above-described embodiments, the thin film piezoelectric actuator 40 of the hard disk unit 1 (hard disk unit 1*a*) may be used as a sensor, such as a distortion sensor, a displacement sensor, a deformation sensor, and a pressure sensor. For example, if the HGA 10 (HGA 10*a*) is accelerated or the head slider 50 contacts the hard disk 5, the first piezoelectric layer 413 and the second piezoelectric layer 423 in the thin film piezoelectric actuator 40 are distorted, and voltage is generated between the first electrode layer 411 and the second electrode layer 412 and between the third electrode layer 421 and the fourth electrode layer 422 by a positive piezoelectric effect. The size and polarity of the voltage depend on the mode of distortion of the thin film piezoelectric actuator 40, and therefore, the thin film piezoelectric actuator 40 can be used as a distortion sensor by providing with a voltmeter that measures the voltage between the first electrode layer 411 and the second electrode layer 412 and between the third electrode layer 421 and the fourth electrode layer 422.

Moreover, if the head slider 50 collides with, for example, a projection in the hard disk 5, the head slider 50 is displaced, and therefore, the first piezoelectric layer 413 and the second piezoelectric layer 423 in the thin film piezoelectric actuator 40 are distorted. Therefore, by means of providing with a voltmeter that measures the voltage between the first electrode layer 411 and the second electrode layer 412 and between the third electrode layer 421 and the fourth electrode layer 422, it is possible to use the thin film piezoelectric actuator 40 as a displacement sensor that detects that the head slider 50 collided with, for example, a projection of the hard disk 5.

Moreover, for example, if the HGA 10 (HGA 10*a*) is deformed due to the displacement of the head slider 50 being fixed, the distortion of the first piezoelectric layer 413 and the second piezoelectric layer 423 in the thin film piezoelectric actuator 40 is also fixed. Therefore, the thin film piezoelectric actuator 40 can be used as a deformation sensor which detects modification of HGA 10 (HGA 10*a*) by providing with a voltmeter which measures the voltage between the first electrode layer 411 and the second electrode layer 412 and between the third electrode layer 421 and the fourth electrode layer 422.

Examples for providing with such a voltmeter include, in the above first embodiment, providing with two voltmeters in the control unit 7, and providing to the switch 15 a function to switch from the first electrical connection relationship shown in FIG. 10 to a third electrical connection relationship in which the first voltmeter is electrically-connected to the first electrode pad 39*a* and the second electrode pad 39*b*, and the second voltmeter is electrically-connected to the third electrode pad 39*c* and the fourth electrode pad 39*d*. Moreover, in the above second embodiment, one voltmeter may be provided in the control unit 7*a*, and a switch that has a function to switch from the electrical connection relationship shown in FIG. 16 to an electrical connection relationship in which the voltmeter is connected between the terminal 31*t* and the terminal 32*t* may be provided in the control unit 7*a* as well.

Moreover, in each of the above-described embodiments, the directions of the first polarization vector 41V and the second polarization vector 42V are parallel with each other. However, the directions of the first polarization vector 41V and the second polarization vector 42V may be anti-parallel with each other. In this case, among the electrode layers at the upper and lower sides of the first piezoelectric layer 413, the electrode layer at the base end side of the first polarization vector 41V becomes the first electrode layer, and the electrode layer at the tip side of the first polarization vector 41V becomes the second electrode layer, and among the electrode layers at the upper and lower sides of the second piezoelectric layer 423, the electrode layer at the base end side of the second polarization vector 42V becomes the third electrode layer, and the electrode layer at the tip side of the second polarization vector 42V becomes the fourth electrode layer.

Moreover, in each of the above-described embodiments, the first piezoelectric layer 413 and the second piezoelectric layer 423 are both configured with a single layer. However, they may be configured with lamination films in which a plurality of layers made of piezoelectric material are laminated. In this case, combining the polarization vectors for each of the layers including a plurality of piezoelectric materials configuring the lamination film makes the first polarization vector and the second polarization vector.

Moreover, in each of the above-described embodiments, the first electrode layer 411, the second electrode layer 412, the third electrode layer 421, and the fourth electrode layer 422 are all configured with a single layer. However, they may be configured with lamination films in which a plurality of layers including electrically-conductive material are laminated.

Moreover, in the above-described first embodiment, the power source 11 includes two power sources, that is, the thin film piezoelectric actuator driving power source 11E1 and the repolarization treatment power source 11E2 (refer to FIG. 10 and FIG. 11). However, if it is possible to generate direct current voltage for performing repolarization treatment of the first piezoelectric layer 413 or the second piezoelectric layer 423, separate from or in addition to the voltage for the piezoelectric actuator driving power source 11E1 to drive the thin film piezoelectric actuator 40, the power source 11 does not need to include the repolarization treatment power source 11E2. In this case, the output terminal 11*a* may be electrically-connected not only to the input terminal 15*r* but also to the input terminal 15*t*, and the output terminal 11*b* may be electrically-connected not only to the input terminal 15*s* but also to the input terminal 15u.

What is claimed is:
1. A method for manufacturing a head gimbal assembly, wherein the head gimbal assembly comprising:
    a head slider having a thin film magnetic head for performing at least one of recording to and reproducing from a magnetic recording medium;
    a suspension to which the head slider is mounted; and
    a thin film piezoelectric actuator for displacing the head slider relatively to the suspension; and
    the method comprising:
    a step for preparing the thin film piezoelectric actuator, the thin film piezoelectric actuator including
        a first piezoelectric laminate including a first electrode layer, a second electrode layer, and a first piezoelectric layer provided between the first electrode layer and the second electrode layer, and
        a second piezoelectric laminate including a third electrode layer, a fourth electrode layer, and a second piezoelectric layer provided between the third electrode layer and the fourth electrode layer, and wherein
        the first piezoelectric layer has a first polarization vector that has a component of a direction that orients from the first electrode layer to the second electrode layer,
        the first piezoelectric laminate does not include a piezoelectric layer other than the first piezoelectric layer,
        the second piezoelectric layer has a second polarization vector that has a component of a direction that orients from the third electrode layer to the fourth electrode layer,
        the second piezoelectric laminate does not include a piezoelectric layer other than the second piezoelectric layer,
        the first piezoelectric laminate and the second piezoelectric laminate are not formed integrally so as to laminate in thickness directions of the first piezoelectric laminate and the second piezoelectric laminate, and
        the first electrode layer, the second electrode layer, the third electrode layer, and the fourth electrode layer are not electrically-connected with each other;
    a suspension preparation step for preparing the suspension, the suspension including
        a first electrode, a second electrode, a third electrode, and a fourth electrode for electrically-connecting to the first electrode layer, the second electrode layer, the third electrode layer, and the fourth electrode layer, respectively, and
        a thin film piezoelectric actuator mounting area comprising a first area in which the first piezoelectric laminate is mounted, and a second area in which the second piezoelectric laminate is mounted;
    a fixing step for fixing the thin film piezoelectric actuator to the thin film piezoelectric actuator mounting area of the suspension;
    an electrical connecting step for electrically-connecting the first electrode layer, the second electrode layer, the third electrode layer, and the fourth electrode layer to the first electrode, the second electrode, the third electrode, and the fourth electrode, respectively;
    a first repolarization treatment step for performing repolarization treatment to the first piezoelectric layer by applying voltage between the first electrode layer and the second electrode layer such that, after the fixing step, an electric field having a direction that orients from the first electrode layer to the second electrode layer is generated in the first piezoelectric layer, and an electric field having a direction opposite to a direction that orients from the third electrode layer to the fourth electrode layer is not generated in the second piezoelectric layer;
    a second repolarization treatment step for performing repolarization treatment to the second piezoelectric layer by applying voltage between the third electrode layer and the fourth electrode layer such that, after the fixing step, an electric field having a direction that orients from the third electrode layer to the fourth electrode layer is generated in the second piezoelectric layer, and an electric field having a direction opposite to a direction that orients from the first electrode layer to the second electrode layer is not generated in the first piezoelectric layer; and
    a step for fixing the head slider to the suspension.
2. The method according to claim 1, wherein
the first electrode, the second electrode, the third electrode, and the fourth electrode of the suspension prepared in the suspension preparation step are not electrically-connected with each other, and the method further comprising an inter-electrode connecting step for electrically-connecting the first electrode to either one of the third electrode and the fourth electrode, and electrically-connecting the second electrode to another one of the third electrode and the fourth electrode.

3. The method according to claim 2, wherein the inter-electrode connecting step is performed after the first repolarization treatment step and the second repolarization treatment step, and in the inter-electrode connecting step, the first electrode and the fourth electrode are electrically-connected, and the second electrode and the third electrode are electrically-connected.

4. The method according to claim 3, wherein the suspension prepared in the suspension preparation step further including:

a first electrically-conductive member which adjoins with both the first electrode and the fourth electrode and is not electrically-connected with both the first electrode and the fourth electrode; and a second electrically-conductive member which adjoins with both the second electrode and the third electrode and is not electrically-connected with both the second electrode and the third electrode; and wherein the electrical connecting step is performed after the first repolarization treatment step and the second repolarization treatment step, the electrical connection of the first electrode and the fourth electrode and the electrical connection of the second electrode and the third electrode in the inter-electrode connecting step is achieved by electrically-connecting further the first electrode and the fourth electrode to the first electrically-conductive member, and electrically-connecting the second electrode and the third electrode to the second electrically-conductive member, in the electrical connecting step.

5. A method for manufacturing a hard disk drive comprising:

a step for manufacturing a head gimbal assembly using the method according to claim 1; and a power source connecting step for electrically-connecting each of the first electrode, the second electrode, the third electrode, and the fourth electrode, to a power source.

6. The method according to claim 5, wherein in the power source connecting step, each of the first electrode, the second electrode, the third electrode, and the fourth electrode are electrically-connected to the power source such that the first piezoelectric layer and the second piezoelectric layer are capable to expand and contract in opposite phase with each other.

* * * * *